(12) United States Patent
Kim et al.

(10) Patent No.: US 12,295,141 B2
(45) Date of Patent: May 6, 2025

(54) MEMORY DEVICE WITH METAL PAD PATTERN AND SYSTEM INCLUDING THE SAME

(71) Applicant: SAMSUNG ELECTRONICS CO., LTD., Suwon-si (KR)

(72) Inventors: Junhyoung Kim, Seoul (KR); Youngjin Kwon, Suwon-si (KR); Jeongeun Kim, Hwaseong-si (KR); Byunggon Park, Seoul (KR); Sungwon Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 623 days.

(21) Appl. No.: 17/204,010

(22) Filed: Mar. 17, 2021

(65) Prior Publication Data

US 2021/0399010 A1 Dec. 23, 2021

(30) Foreign Application Priority Data

Jun. 17, 2020 (KR) .................. 10-2020-0073654

(51) Int. Cl.
*H10B 43/27* (2023.01)
*H01L 23/528* (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 7,847,342 B2 12/2010 Fukuzumi et al.
8,824,184 B2 9/2014 Baek et al.
(Continued)

FOREIGN PATENT DOCUMENTS

CN 111326523 A 6/2020
KR 10-2014-0083528 A 7/2014
(Continued)

OTHER PUBLICATIONS

Extended European Search Report dated Nov. 10, 2021 for corresponding EP 21179643.8.
(Continued)

*Primary Examiner* — Didarul A Mazumder
*Assistant Examiner* — Gustavo G Ramallo
(74) *Attorney, Agent, or Firm* — Fish & Richardson P.C.

(57) ABSTRACT

A memory device includes a lower structure, a stacked structure on the lower structure, the stacked structure including horizontal layers and interlayer insulating layers alternately stacked in a vertical direction, and each of the horizontal layers including a gate electrode, a vertical structure penetrating through the stacked structure in the vertical direction, the vertical structure having a core region, a pad pattern with a pad metal pattern on the core region, a dielectric structure including a first portion facing a side surface of the core region, a second portion facing at least a portion of a side surface of the pad metal pattern, and a data storage layer, and a channel layer between the dielectric structure and the core region, a contact structure on the vertical structure, and a conductive line on the contact structure.

20 Claims, 28 Drawing Sheets

(51) Int. Cl.
*H10B 41/10* (2023.01)
*H10B 41/27* (2023.01)
*H10B 41/40* (2023.01)
*H10B 41/50* (2023.01)
*H10B 43/10* (2023.01)
*H10B 43/40* (2023.01)
*H10B 51/50* (2023.01)

(52) U.S. Cl.
CPC .............. *H10B 41/27* (2023.02); *H10B 41/40* (2023.02); *H10B 41/50* (2023.02); *H10B 43/10* (2023.02); *H10B 43/40* (2023.02); *H10B 51/50* (2023.02)

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40
See application file for complete search history.

(56) References Cited

U.S. PATENT DOCUMENTS

| | | | |
|---|---|---|---|
| 8,853,766 B2 | 10/2014 | Maeda et al. | |
| 9,570,346 B2 | 2/2017 | Yamaguchi | |
| 9,721,663 B1 | 8/2017 | Ogawa et al. | |
| 9,893,074 B2 | 2/2018 | Lee et al. | |
| 9,935,124 B2 | 4/2018 | Nishikawa et al. | |
| 10,002,875 B2 | 6/2018 | Nam et al. | |
| 10,580,788 B2 | 3/2020 | Zhu et al. | |
| 2002/0053739 A1* | 5/2002 | Honma | H01L 23/642 257/E21.59 |
| 2007/0080382 A1* | 4/2007 | Kikuchi | H01L 21/76846 257/295 |
| 2009/0146206 A1* | 6/2009 | Fukuzumi | H10B 43/20 257/E21.442 |
| 2012/0228697 A1* | 9/2012 | Youm | H10B 43/27 257/329 |
| 2015/0294977 A1* | 10/2015 | Kim | H10B 43/40 257/314 |
| 2019/0074289 A1* | 3/2019 | Hwang | H01L 23/535 |
| 2019/0252402 A1 | 8/2019 | Lee et al. | |
| 2020/0006371 A1* | 1/2020 | Huo | H10B 41/35 |
| 2020/0144284 A1 | 5/2020 | Choi et al. | |
| 2020/0194373 A1 | 6/2020 | Baek et al. | |
| 2020/0303405 A1* | 9/2020 | Nakajima | H10B 43/10 |
| 2021/0384218 A1* | 12/2021 | Baek | H10B 43/50 |
| 2022/0310639 A1* | 9/2022 | Chung | H10B 43/27 |

FOREIGN PATENT DOCUMENTS

| | | |
|---|---|---|
| KR | 10-2016-0000503 | 1/2016 |
| KR | 10-2019-0097471 | 8/2019 |
| KR | 10-2020-0053067 | 5/2020 |

OTHER PUBLICATIONS

Office Action in Korean Appln. No. 10-2020-0073654, mailed on Jun. 28, 2024, 9 pages (with English translation).

* cited by examiner

MEMORY DEVICE WITH METAL PAD PATTERN AND SYSTEM INCLUDING THE SAME

CROSS-REFERENCE TO RELATED APPLICATION

Korean Patent Application No. 10-2020-0073654, filed on Jun. 17, 2020, in the Korean Intellectual Property Office, and entitled: "Memory Device and System Including the Same," is incorporated by reference herein in its entirety.

BACKGROUND

1. Field

Embodiments relate to a memory device and a system including the same.

2. Description of the Related Art

As demand for high performance, high speed and/or multifunctionality of semiconductor devices increases, the degree of integration of memory devices increases. To increase the degree of integration of a memory device, instead of disposing the gates on a two-dimensional plane, a method of disposing gates in a vertical direction has been proposed.

SUMMARY

According to example embodiments, a memory device includes a lower structure, a stacked structure including horizontal layers and interlayer insulating layers alternately stacked on the lower structure in a vertical direction, a vertical structure penetrating through the stacked structure in the vertical direction, a contact structure disposed on the vertical structure, and a conductive line disposed on the contact structure. Each of the horizontal layers includes a gate electrode, the vertical structure includes a core region, a pad pattern including a pad metal pattern, on the core region, a dielectric structure including a first portion facing a side surface of the core region and a second portion facing at least a portion of a side surface of the pad metal pattern, and a channel layer between the dielectric structure and the core region, and the dielectric structure includes a data storage layer.

According to example embodiments, a memory device includes a lower structure, a stacked structure on the lower structure, the stacked structure including gate layers and interlayer insulating layers alternately stacked in a vertical direction, and gate pads extending from the gate layers and arranged in a stepped shape, a first vertical structure penetrating through the stacked structure in a vertical direction, perpendicular to an upper surface of the lower structure, a first contact structure on the first vertical structure, gate contact structures on the gate pads, a peripheral contact structure spaced apart from the gate layers, a conductive line on the first contact structure, and gate connection wirings on the gate contact structures. The first contact structure includes a first lower contact plug contacting the first vertical structure, and a first upper contact plug disposed on the first lower contact plug and contacting the first lower contact plug. The first vertical structure includes a core region, a dielectric structure including a data storage layer, on a side surface of the core region, a pad metal pattern on the core region, and a semiconductor layer facing at least a portion of a side surface of the pad metal pattern.

According to example embodiments, a system includes a memory device, and a controller device electrically connected to the memory device. The memory device includes a lower structure, a stacked structure on the lower structure, the stacked structure including gate layers and interlayer insulating layers alternately stacked in a vertical direction, and gate pads extending from the gate layers and arranged in a stepped shape, a vertical structure penetrating through the stacked structure in a vertical direction, perpendicular to an upper surface of the lower structure, a first contact structure on the first vertical structure, gate contact structures on the gate pads, a second contact structure spaced apart from the gate layers and the vertical structure, a conductive line on the first contact structure, gate connection wirings on the gate contact structures, and a peripheral connection wiring on the second contact structure. The first contact structure includes a first lower contact plug contacting a pad pattern, and a first upper contact plug disposed on the first lower contact plug and contacting the first lower contact plug. The vertical structure includes a core region, a dielectric structure including a data storage layer, on a side surface of the core region, a pad metal pattern on the core region, and a semiconductor layer facing at least a portion of a side surface of the pad metal pattern.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
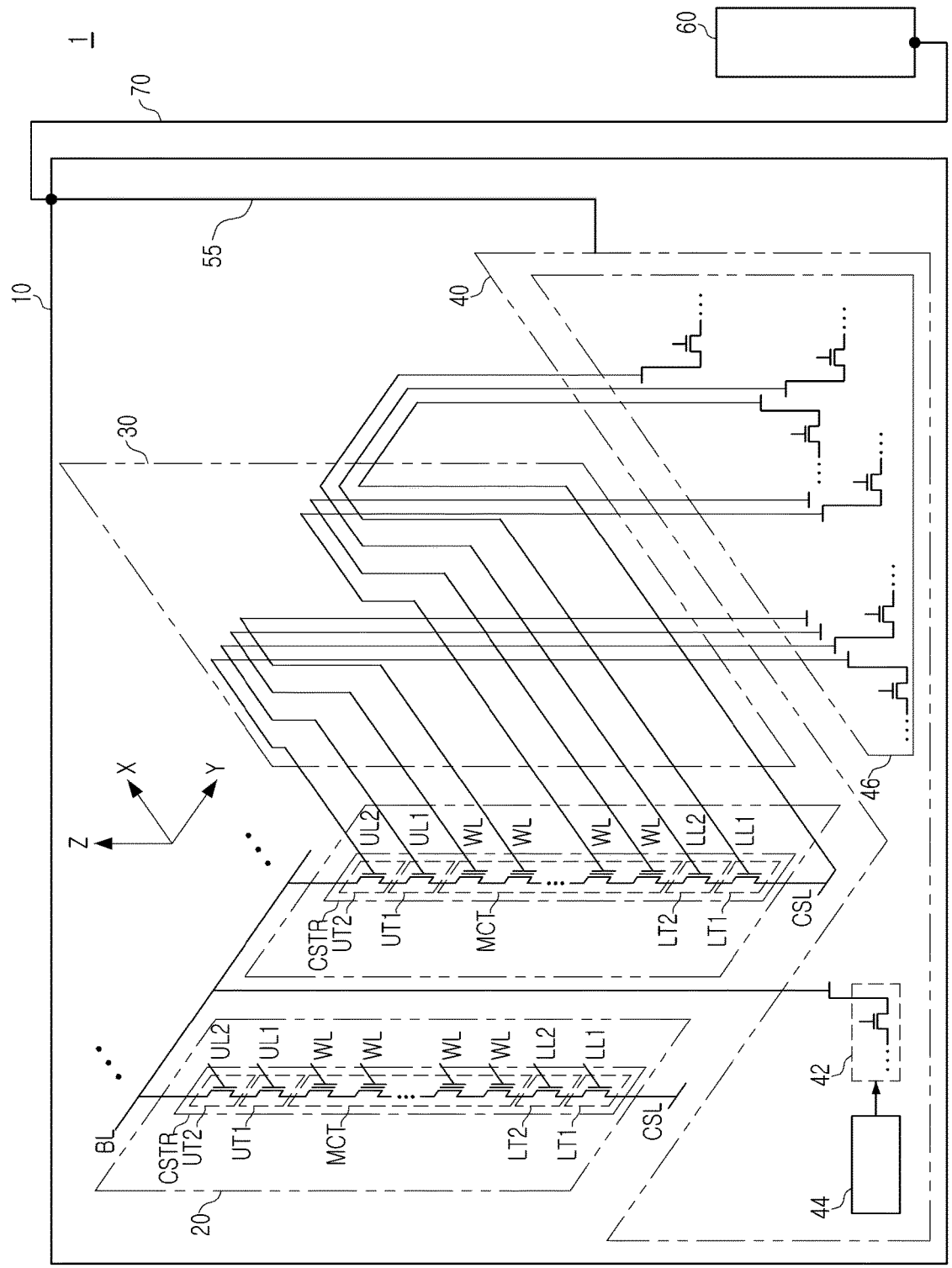
FIG. 1 is a schematic diagram of a system including a memory device according to an example embodiment.

FIG. 1 is a schematic diagram of a system including a memory device according to an example embodiment.

Referring to FIG. 1, in an example embodiment, a system 1 may include a memory device 10 according to an example embodiment, and a controller device 60 electrically connected to the memory device 10 through a connection structure 70. The system 1 may be a data storage system. In an example, the connection structure 70 may be, e.g., a printed circuit board or a board on which a plurality of packages are mounted.

In an example, the memory device 10 may be a nonvolatile memory device. For example, the memory device 10 may be a NAND flash memory device, but embodiments are not limited thereto. For example, the memory device 10 may be a variable resistance memory device that stores information using a change in resistance.

In an example, the memory device 10 may be a component of the system 1 formed in the form of a semiconductor package. The memory device 10 may be a single semiconductor chip or a semiconductor package including stacked semiconductor chips. In this case, each of the stacked semiconductor chips may be a nonvolatile memory device, e.g., a NAND flash memory device.

In an example, the controller device 60 may be formed as another semiconductor package spaced apart from the memory device 10 formed in the form of a semiconductor package. In another example, the controller device 60 may be included in a single semiconductor package, together with the memory device 10.

In an example, the controller device 60 may be electrically connected to the memory device 10 to control operations of the memory device 10. For example, the controller device 60 may exchange commands and/or data with the memory device 10.

In an example, the system 1 may be a data storage device, e.g., a solid state drive (SSD). In another example, the system 1 may be an electronic device including a storage device and a display device.

The memory device 10 may include a bit line BL, a common source line CSL, word lines WL, upper gate lines UL1 and UL2, lower gate lines LL1 and LL2, and a cell string CSTR between the bit line BL and the common source line CSL. The cell string CSTR may include one or more lower transistors LT1 and LT2 adjacent to the common source line CSL, one or more upper transistors UT1 and UT2 adjacent to the bit line BL, and a plurality of memory cell transistors MCT disposed between the one or more lower transistors LT1 and LT2 and the one or more upper transistors UT1 and UT2.

The one or more lower transistors LT1 and LT2, the plurality of memory cell transistors MCT, and the one or more upper transistors UT1 and UT2 may be connected in series. In an example, the one or more upper transistors UT1 and UT2 may include a string selection transistor, and the one or more lower transistors LT1 and LT2 may include a ground selection transistor.

In an example, the one or plurality of lower transistors LT1 and LT2 may be provided in plural, and the plurality of lower transistors LT1 and LT2 may include a lower erase control transistor LT1 and a ground selection transistor LT2 connected in series. The ground selection transistor LT2 may be disposed on the lower erase control transistor LT1.

In an example, the one or more upper transistors UT1 and UT2 may be provided in plural, and the plurality of upper transistors UT1 and UT2 may include a string selection transistor UT1 and an upper erase control transistor UT2 connected in series. The upper erase control transistor UT2 may be disposed on the string selection transistor UT1.

The lower gate lines LL1 and LL2 may include a first lower gate line LL1 and a second lower gate line LL2, and the upper gate lines UL1 and UL2 may include a first upper gate line UL1 and the second upper gate line UL2. The first lower gate line LL1 may be a gate electrode of the lower erase transistor LT1, and the second lower gate line LL2 may be a gate electrode of the ground selection transistor LT1. The word Lines WL may be gate electrodes of the memory cell transistors MCT, and the first upper gate line UL1 may be a gate electrode of the string selection transistor UT1, and the second upper gate line UL2 may be a gate electrode of the upper erase transistor UT2.

An erase operation of erasing data stored in the memory cell transistors MCT may use a gate induced drain leakage (GIDL) phenomenon occurring in the lower and upper erase transistors LT1 and UT2. For example, holes generated by the GIDL phenomenon in the lower and upper erase transistors LT1 and UT2 are injected into the channels of the memory cell transistors MCT, and the data of the memory cell transistors MCT may be erased by the holes injected into the channels of the cell transistors MCT. For example, holes injected into the channels of the memory cell transistors MCT may enable electrons trapped in the data storage layer of the memory cell transistors MCT to escape to the channels of the memory cell transistors MCT.

In the memory device 10, a plurality of cell strings CSTR may be arranged. An area in which the plurality of cell strings CSTR are arranged may be defined as a memory cell array area 20. In the memory device 10, a plurality of cell strings CSTR may be electrically connected to one bit line BL, and the bit line BL that is electrically connected to the plurality of cell strings CSTR as described above may be disposed in plural.

The memory device 10 may further include a peripheral circuit area 40. A peripheral circuit of the peripheral circuit area 40 may include a row decoder 46, a page buffer 42, and a column decoder 44.

The word lines WL, the upper gate lines UL1 and UL2, and the lower gate lines LL1 and LL2 may extend from the memory cell array area 20 to a gate connection area 30 adjacent to the memory cell array area 20, and may include gate pads arranged in a stepped shape in the gate connection area 30. The memory cell transistors MCT may be electrically connected to the row decoder 46 through the word lines WL, the upper gate lines UL1 and UL2, and the lower gate lines LL1 and LL2, and may be connected to the page buffer 42 and the column decoder 44 through the bit line BL.

The connection structure 70 may be electrically connected to the memory device 10 by a connection line 55 connected to the peripheral circuit area 40 in the memory device 10.

Figure 2A:
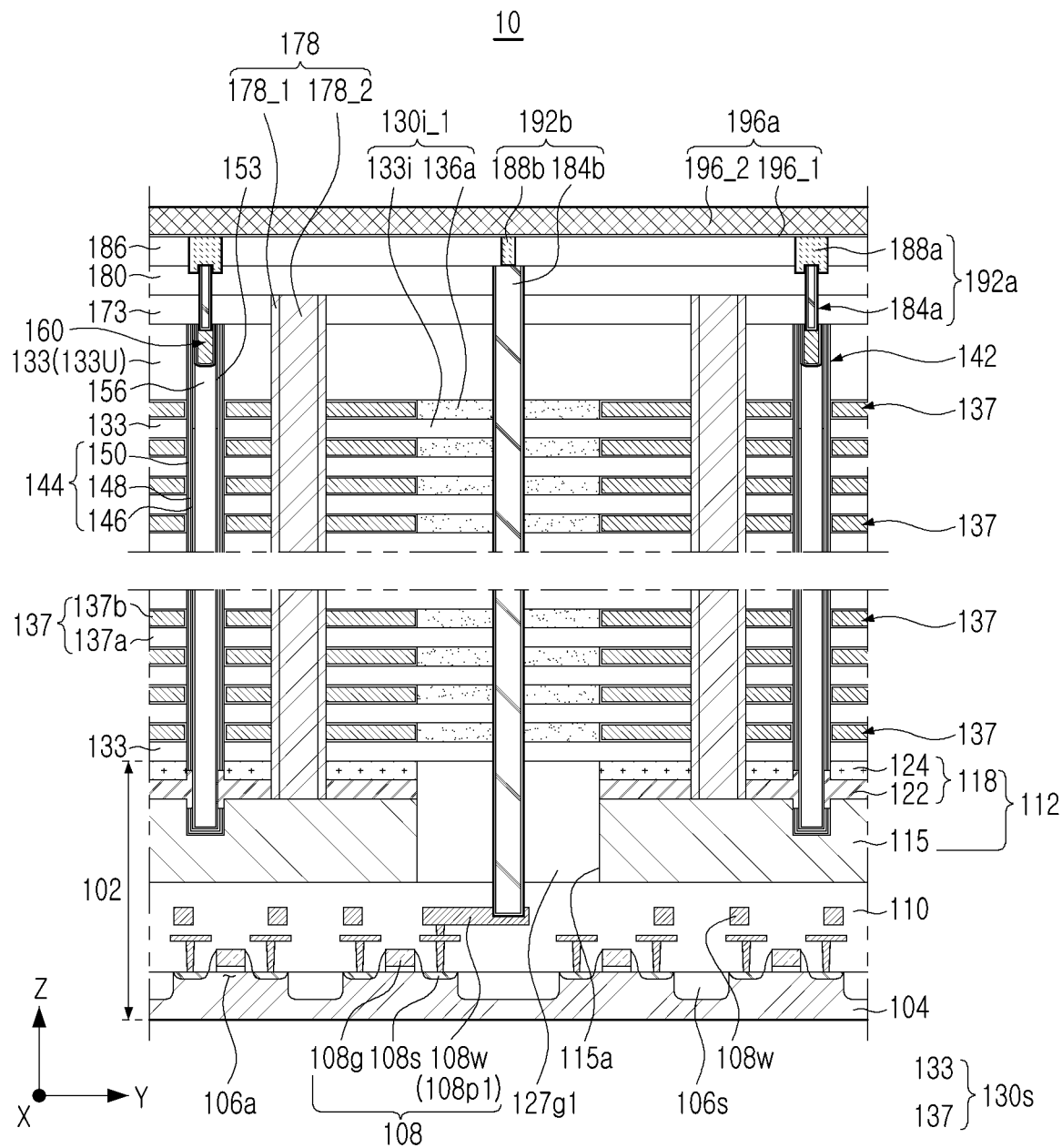
FIGS. 2A and 2B are cross-sectional views illustrating a memory device according to an example embodiment.
Figure 2B:
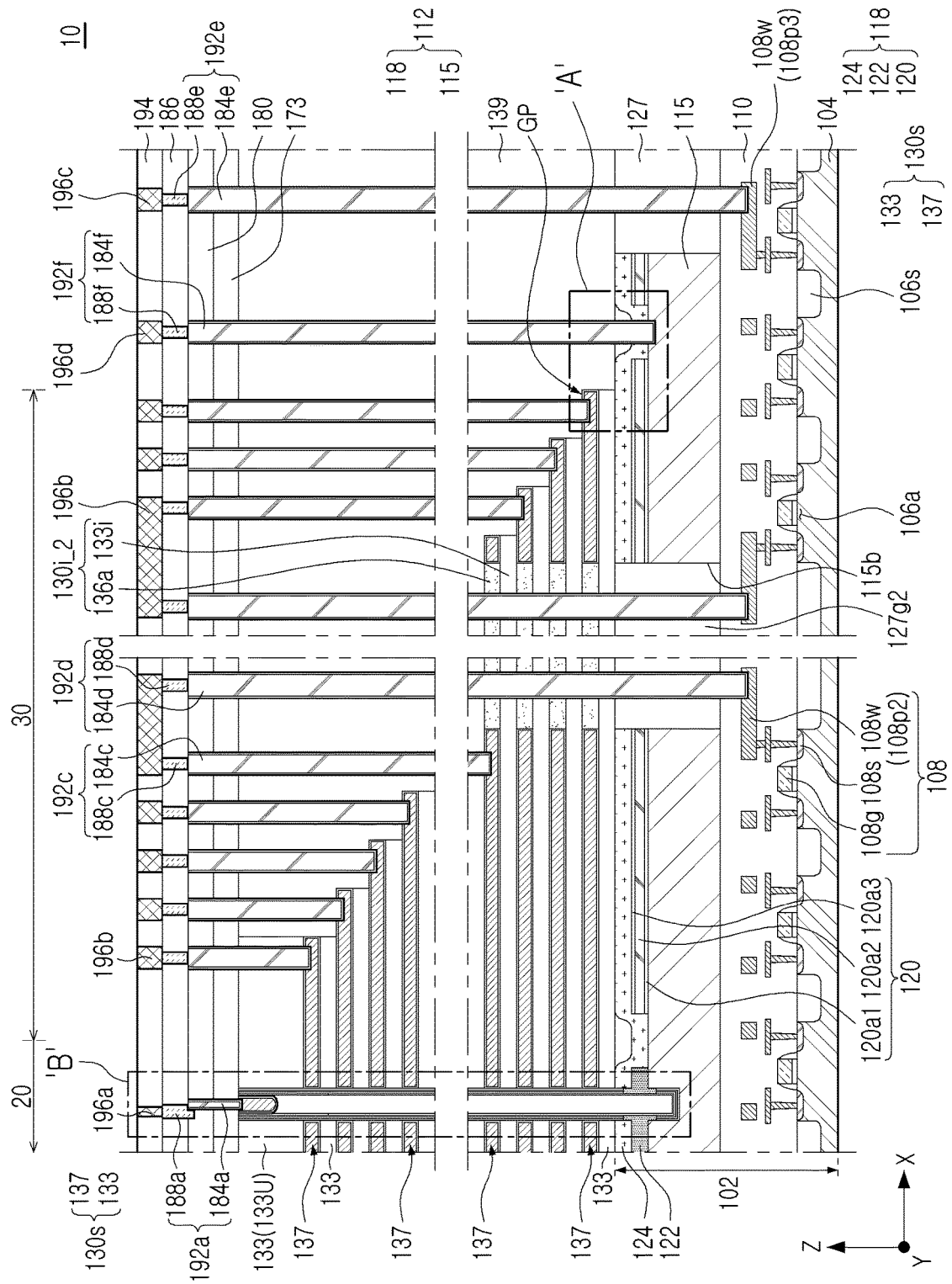
Figure 2C:
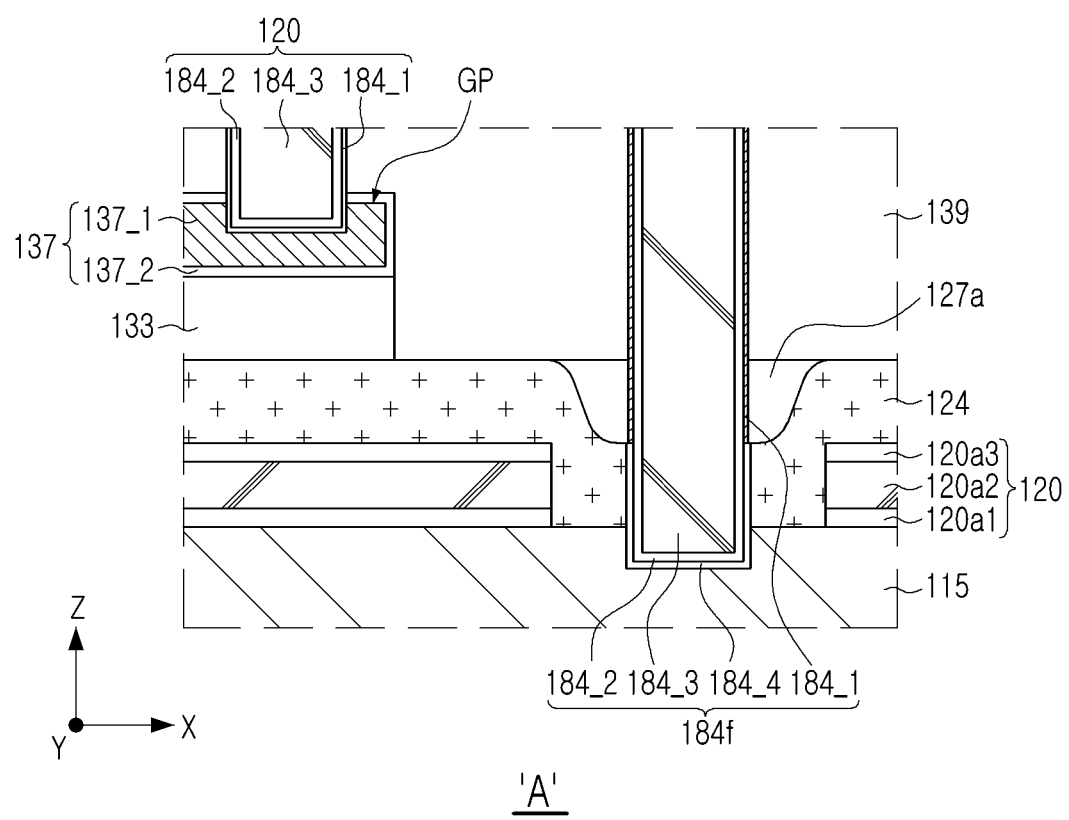
FIGS. 2C and 3 are partially enlarged cross-sectional views of FIG. 2B.

Next, the memory device 10 according to an example embodiment will be described in more detail with reference to FIGS. 2A to 2C. FIG. 2A illustrates a cross-sectional structure of a portion of the memory cell array area 20 cut in the Y direction in the memory device 10 described with reference to FIG. 1. FIG. 2B is a cross-sectional view of the gate connection area 30 and a portion of the memory cell array area 20 in the X direction perpendicular to the Y direction, in the memory device 10 described with reference to FIG. 1. FIG. 2C is an enlarged view of portion "A" in FIG. 2B.

First, with reference to FIGS. 1 and 2A, a cross-sectional structure of a portion of the memory cell array area 20 cut in the Y direction in the memory device 10 described with reference to FIG. 1 will be described.

Referring to FIGS. 1 and 2A, the memory device 10 may include a lower structure 102, a stacked structure 130s on the lower structure 102, vertical structures 142 penetrating through the stacked structure 130s, and a conductive line 196a on the vertical structures 142. In an example, the conductive line 196a may be the bit line BL described with reference to FIG. 1.

The lower structure 102 may include a substrate 104, a peripheral circuit 108 on the substrate 104, a lower insulating layer 110 covering the peripheral circuit 108, a pattern structure 112 disposed on the lower insulating layer 110 and having a first opening 115a, and a first gap-fill insulating layer 127g1 filling the first opening 115a.

The substrate 104 may be a semiconductor substrate that may be formed of a semiconductor material, e.g., silicon or the like. The peripheral circuit 108 may include the row decoder 46, the page buffer 42, and the column decoder 44 described with reference to FIG. 1. The peripheral circuit 108 may include a peripheral transistor including a peripheral gate 108g and a peripheral source/drain 108s, and a peripheral wiring 108w. The peripheral wiring 108w may include peripheral pads, e.g., a first peripheral pad 108p1.

The peripheral gate 108g may be formed on an active region 106a defined by a device isolation layer 106s formed in the substrate 104. The peripheral source/drain 108s may be formed in the active region 106a on both sides of the peripheral gate 108g. The lower insulating layer 110 may cover the peripheral circuit 108.

The pattern structure 112 may include a pattern layer 115. The pattern layer 115 may be a silicon layer. At least a portion of the pattern layer 115 may be a silicon layer having N-type conductivity.

In an example, the pattern structure 112 may include a horizontal connection layer 118 that may be disposed on the pattern layer 115 to contact the pattern layer 115. In an example, the horizontal connection layer 118 may include a lower horizontal connection layer 122 and an upper horizontal connection layer 124 that may be disposed on the lower horizontal connection layer 122 to contact the lower horizontal connection layer 122.

At least one of the lower horizontal connection layer 122 and the upper horizontal connection layer 124 may include a doped silicon layer. For example, the lower horizontal connection layer 122 and the upper horizontal connection layer 124 may include a silicon layer having N-type conductivity. In another example, the doped silicon layer may be replaced with a doped germanium layer or a doped silicon-germanium layer.

The stacked structure 130s may include horizontal layers 137 and interlayer insulating layers 133 alternately and repeatedly stacked on the lower structure 102. Among the horizontal layers 137 and the interlayer insulating layers 133, a lowermost layer and an uppermost layer may be interlayer insulating layers. An uppermost interlayer insulating layer 133U among the interlayer insulating layers 133 may have a thickness greater than that of each of the other interlayer insulating layers. The interlayer insulating layers 133 may be formed of, e.g., silicon oxide.

The vertical structures 142 may be disposed in channel holes 140 penetrating through the stacked structure 130s in the vertical direction Z. The vertical direction Z may be a direction perpendicular to the upper surface of the lower structure 102.

Each of the vertical structures 142 may include a dielectric structure 144, a channel layer 153, a core region 156, and a pad pattern 160. The pad pattern 160 may be disposed on the core region 156. At least a portion of the channel layer 153 may be disposed on a side surface of the core region 156 and a side surface of the pad pattern 160. The dielectric structure 144 may cover an outer side surface and a bottom surface of the channel layer 153. In an example, the vertical structures 142 may penetrate through the stacked structure 130s and extend downwardly to penetrate through the horizontal connection layer 118 and extend into the pattern layer 115.

In an example, the channel layer 153 may further include a portion covering the bottom surface of the core region 156, and the dielectric structure 144 may include a portion covering the bottom surface of the channel layer 153. In an example, the lower horizontal connection layer 122 of the horizontal connection layer 118 may penetrate through the dielectric structure 144 and may contact the channel layer 153, and a portion of the dielectric structure 144 and an extended portion of the lower horizontal connection layer 122 may be interposed between the upper horizontal connection layer 124 and the channel layer 153.

In an example, the memory device 10 may further include a first upper insulating layer 173, a second upper insulating layer 180, and a third upper insulating layer 186 that are sequentially stacked on the stacked structure 130s. In an example, the memory device 10 may further include a trench 176 (FIG. 11A) penetrating through the first upper insulating layer 173, the stacked structure 130s, and the horizontal connection layer 118, and a separation structure 178 within the trench 176.

In an example, the separation structure 178 may include a first separation pattern 178_1 and a second separation pattern 178_2. The first separation pattern 178_1 may be disposed on a side surface of the second separation pattern 178_2.

In an example, the first and second separation patterns 178_1 and 178_2 may be formed of an insulating material. In another example, the first separation pattern 178_1 may be formed of an insulating material, and the second separation pattern 178_2 may include a conductive material (e.g., doped polysilicon, metal nitride, a metal-semiconductor compound, a metal, or the like).

In an example, the memory device 10 may further include a first insulating region 130i_1 defined in a partial region of the stacked structure 130s. The first insulating region 130i_1 may overlap the first gap-fill insulating layer 127g1.

In an example, the first insulating region 130i_1 may include insulating layers 136a positioned at substantially the same height level as the horizontal layers 137 of the stacked structure 130s, and insulating portions 133i adjacent to the insulating layers 136a in the vertical direction Z and extending from the interlayer insulating layers 133. In another example, the first insulating region 130i_1 may also be formed of a columnar insulating pattern.

In an example, the memory device 10 may further include bit line contact structures 192a and first peripheral contact structures 192b. Each of the bit line contact structures 192a may include a lower bit line contact plug 184a and an upper bit line contact plug 188a. The first peripheral contact structure 192b may include a first peripheral lower contact plug 184b and a first peripheral upper contact plug 188b.

In each of the bit line contact structures 192a, the lower bit line contact plug 184a penetrates through the first and second upper insulating layers 173 and 180, and may be electrically connected to the vertical structures 142, respectively, and the upper bit line contact plug 188a may penetrate through the third upper insulating layer 186 and may be electrically connected to the lower bit line contact plug 184a.

The first peripheral lower contact plug 184b extends into the lower insulating layer 110, while penetrating through the first and second upper insulating layers 173 and 180, the first insulating region 130i_1, and the first gap-fill insulating layer 127g1, and may be electrically connected to the first peripheral pad 108p1 of the peripheral wiring 108w. The first peripheral upper contact plug 188b may penetrate through the third upper insulating layer 186 and may be electrically connected to the first peripheral lower contact plug 184b. The conductive line 196a, which may be a bit line (BL of FIG. 1), may be electrically connected to the bit line contact structures 192a and the first peripheral contact structures 192b.

Next, referring to FIGS. 1, 2B and 2C, a cross-sectional structure of a portion of the memory cell array area 20, and the gate connection area 30, cut in the X direction in the memory device 10 described with reference to FIG. 1, will be described.

Referring to FIGS. 1, 2B and 2C, in an example, the horizontal connection layer 118 may further include an intermediate structure 120. The intermediate structure 120 may include a first layer 120a1, a second layer 120a2, and a third layer 120a3 that are sequentially stacked. The first and third layers 120a1 and 120a3 may include, e.g., silicon oxide. The second layer 120a2 may include, e.g., silicon nitride or silicon oxide. The upper horizontal connection layer 124 may cover the lower horizontal connection layer 122 and the intermediate structure 120.

In an example, in a boundary region between the memory cell array area 20 and the gate connection area 30, the intermediate structure 120 and the lower horizontal connection layer 122 may be spaced apart from each other. Between the intermediate structure 120 and the lower horizontal connection layer 122 spaced apart from each other, the upper horizontal connection layer 124 may contact the pattern layer 115.

In an example, the intermediate structure 120 may include portions spaced apart from each other in a region not overlapping with the stacked structure 130s, and between the portions of the intermediate structure 120 spaced apart from each other, and between the intermediate structure 120 and the lower horizontal connection layer 122 spaced apart from each other, the upper horizontal connection layer 124 may contact the pattern layer 115.

In an example, the pattern structure 112 may have a second opening 115b. In an example, the memory device 10 may further include a second gap-fill insulating layer 127g2 filling the second opening 115b, and an intermediate insulating layer 127 on an outer side surface of the pattern structure 112.

The stacked structure 130s may extend from the memory cell array area 20 into the gate connection area 30. In the stacked structure 130s, the horizontal layers 137 and the interlayer insulating layers 133 may extend from the memory cell array area 20 into the gate connection area 30. In the gate connection area 30, the stacked structure 130s may include gate pads GP arranged in a stepped shape in the gate connection area 30. The stepped shape in which the gate pads GP are arranged is not limited to the shape illustrated in FIG. 2B and may be modified in various shapes.

In an example, the memory device 10 may further include a capping insulating layer 139 having an upper surface substantially coplanar with the upper surface of the uppermost interlayer insulating layer 133U. The capping insulating layer 139 may be formed of, e.g., silicon oxide. The first to third upper insulating layers 173, 180 and 186 described with reference to FIG. 2A may be sequentially stacked on the stacked structure 130s and the capping insulating layer 139.

In an example, the memory device 10 may further include a second insulating region 130i_2 defined in a partial region of the stacked structure 130s. The second insulating region 130i_2 may overlap the second gap-fill insulating layer 127g2.

In an example, the second insulating region 130i_2 includes insulating layers 136a positioned at substantially the same height level as the horizontal layers 137 of the stacked structure 130s in the gate connection area 30, and insulating portions 133i adjacent to the insulating layers 136a in the vertical direction Z and extending from the interlayer insulating layers 133. In another example, the second insulating region 130i_2 may be formed in a columnar insulating pattern.

In an example, the memory device 10 may further include gate peripheral contact structures 192c, a second peripheral contact structure 192d, a third peripheral contact structure 192e, and a fourth peripheral contact structure 192f. Each of the gate peripheral contact structures 192c may include a lower gate contact plug 184c and an upper gate contact plug 188c sequentially stacked. The second peripheral contact structure 192d may include a second peripheral lower contact plug 184d and a second peripheral upper contact plug 188d sequentially stacked. The third peripheral contact structure 192e may include a third peripheral lower contact plug 184e and a third peripheral upper contact plug 188e that are sequentially stacked. The fourth peripheral contact structure 192f may include a fourth peripheral lower contact plug 184f and a fourth peripheral upper contact plug 188f sequentially stacked.

The lower bit line contact plugs 184a, the first peripheral lower contact plug 184b, the lower gate contact plugs 184c, the second peripheral lower contact plug 184d, the third peripheral lower contact plug 184e, and the fourth peripheral lower contact plug 184f may have upper surfaces positioned at the same height level.

The lower gate contact plugs 184c are in contact with and electrically connected to the gate pads GP, and extend upwardly to penetrate through the capping insulating layer 139 and the first and second upper insulating layers 173 and 180. The second peripheral lower contact plug 184d is in contact with and electrically connected to a second peripheral pad 108p2 of the peripheral wiring 180w, and extends upwardly to penetrate through the second insulating region 130i_2, the capping insulating layer 139 and the first and second upper insulating layers 173 and 180. The third peripheral lower contact plug 184e is in contact with and electrically connected to the third peripheral pad 108p3 of the peripheral wiring 180w, and extends upwardly to penetrate through the intermediate insulating layer 127 and the capping insulating layer 139 and the first and second upper insulating layers 173 and 180. The fourth peripheral lower contact plug 184f is in contact with and electrically connected to the upper horizontal connection layer 124 of the pattern structure 112 and the pattern layer 115, and extends upwardly to penetrate through the capping insulating layer 139 and the first and second upper insulating layers 173 and 180.

In an example, the memory device 10 may further include a gate connection wiring 196b electrically connected to the gate peripheral contact structures 192c and the second peripheral contact structure 192d, a peripheral connection wiring 196c electrically connected to the third peripheral contact structure 192e, and a source connection wiring 196d electrically connected to the fourth peripheral contact structure 192f.

The lower bit line contact plugs 184a, the first peripheral lower contact plug 184b, the lower gate contact plugs 184c, the second peripheral lower contact plug 184d, the third peripheral lower contact plug 184*e* and the fourth peripheral lower contact plug 184*f* may include the same first lower plug layer 184_1, second lower plug layer 184_2 and lower plug pattern 184_3.

In the lower bit line contact plugs 184*a*, the first peripheral lower contact plug 184*b*, the lower gate contact plugs 184*c*, the second peripheral lower contact plug 184*d* and the third peripheral lower contact plug 184*e*, the second lower plug layer 184_2 may cover a side surface and a bottom surface of the lower plug pattern 184_3, and the first lower plug layer 184_1 may cover the outer side surface and the bottom surface of the second lower plug layer 184_2.

In the case of the fourth peripheral lower contact plug 184*f*, the second lower plug layer 184_2 may cover a side surface and a bottom surface of the lower plug pattern 184_3, and the first lower plug layer 184_1 may cover an outer side surface of the second lower plug layer 184_2. The fourth peripheral lower contact plug 184*f* may penetrate through the upper horizontal connection layer 124 and may extend into the pattern layer 115. The fourth peripheral lower contact plug 184*f* may further include a metal-semiconductor compound layer 184_4 in contact with the upper horizontal connection layer 124 and the pattern layer 115.

The first lower plug layer 184_1 may include a first metal, e.g., Ti or Ta, and the second lower plug layer 184_2 may include a metal nitride, e.g., TiN, TaN, or WN, and the lower plug pattern 184_3 may include a second metal, e.g., W. The metal-semiconductor compound layer 184_4 may be formed of the first metal of the first lower plug layer 184_1 and a silicon compound, e.g., TiSi, TaSi, WSi, or the like. of the upper horizontal connection layer 124 and the pattern layer 115.

In an example, the memory device 10 may be electrically connected to the connection structure 70 described with reference to FIG. 1 through the third peripheral contact plug 19*e* and the peripheral connection wiring 96*e*. In the memory device 10 of FIG. 1, a connection line 55 connecting the connection structure 70 and the peripheral circuit area 40 may be the third peripheral contact plug 19*e* and the peripheral connection wiring 96*e*.

Figure 3:
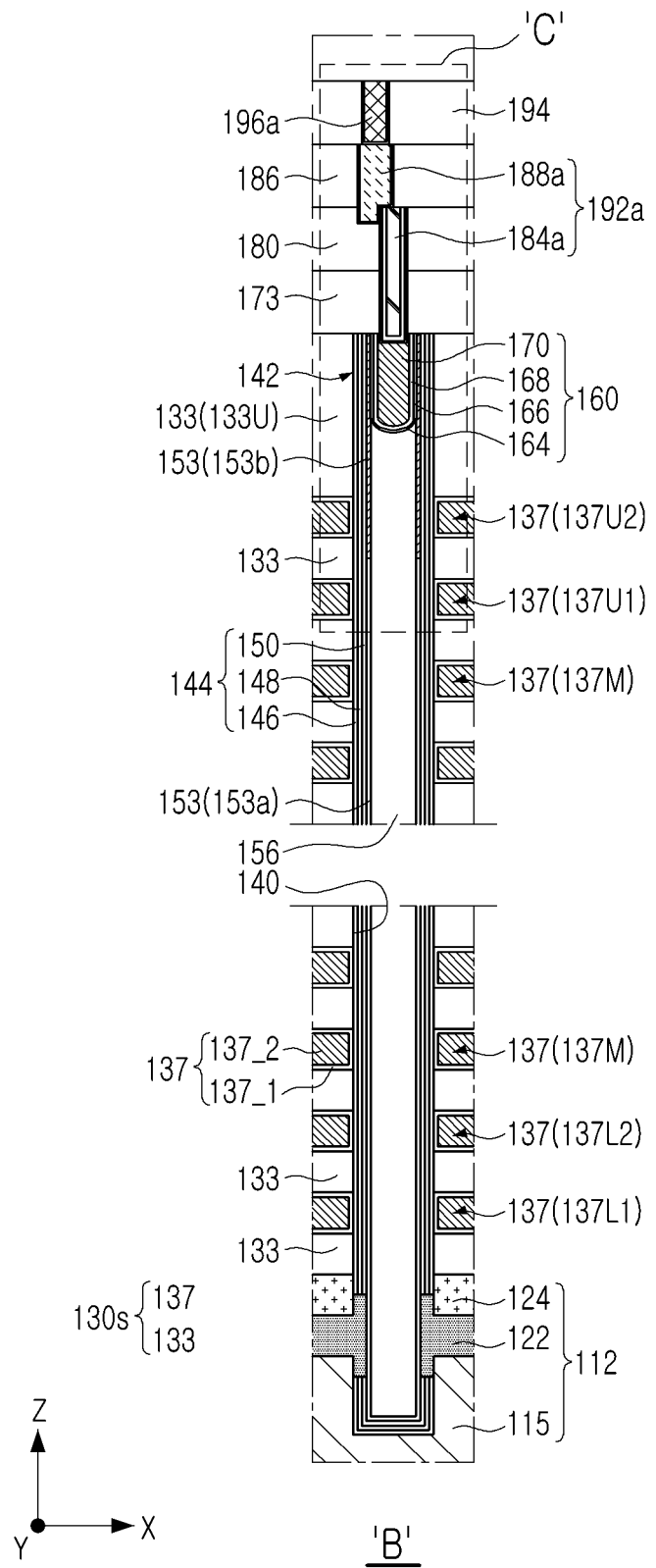

Next, with reference to FIG. 3, the stacked structure 130*s* and the vertical structure 142 in the memory cell array area 20 will be described. FIG. 3 is a partially enlarged view of portion "B" in FIG. 2B.

Referring to FIGS. 2B and 3, each of the horizontal layers 137 may include a gate conductive material. In an example, each of the horizontal layers 137 may include a first layer 137_1 and a second layer 137_2. The first layer 137_1 may extend to between the vertical structure 142 and a side surface of the second layer 137_2 while covering the upper and lower surfaces of the second layer 137_2.

In an example, the first layer 137_1 may include a dielectric material, and the second layer 137_2 may include a conductive material. For example, the first layer 137_1 may include a high-k dielectric, e.g., AlO or the like, and the second layer 137_2 may include a conductive material, e.g., TiN, TaN, WN, TiSi, WSi, TaSi, Ti, W, or the like. In another example, the first layer 137_1 may include a first conductive material, e.g., TiN, TaN, WN, etc., and the second layer 137_2 may include a second conductive material, e.g., Ti, Ta, W, or the like, different from the first conductive material.

In another example, each of the horizontal layers 137 may also be formed of a single conductive material layer without distinction between the first layer 137_1 and the second layer 137_2. For example, each of the horizontal layers 137 may be formed of doped polysilicon, a metal-semiconductor compound, e.g., TiSi, TaSi, CoSi, NiSi or WSi, a metal nitride, e.g., TiN, TaN or WN, or a metal e.g., Ti, Ta, or W.

In each of the horizontal layers 137, a portion formed of a conductive material, e.g., the second layer 137_2, may be referred to as a gate electrode, a gate line, or a gate layer. In an example, the horizontal layers 137 may include first and second lower gate layers 137L1 and 137L2, intermediate gate layers 137M above the first and second lower gate layers 137L1 and 137L2, and first and second upper gate layers 137U1 and 137U2 above the intermediate gate layers 137M.

The first and second lower gate layers 137L1 and 137L2 may correspond to the first and second lower gate lines LL1 and LL2 described with reference to FIG. 1, and at least some of the intermediate gate layers 137M may correspond to the word lines WL described with reference to FIG. 1, and the first and second upper gate layers 137U1 and 137U2 may correspond to the first and second upper gate lines UL1 and UL2 described with reference to FIG. 1.

The vertical structure 142 may be disposed in the channel hole 140 penetrating through the stacked structure 130*s* and extending into the pattern structure 112. In the vertical structure 142, the dielectric structure 144 may include a first dielectric layer 146, a data storage layer 148 and a second dielectric layer 150. The first dielectric layer 146 may conformally cover the inner wall of the channel hole 140, and the data storage layer 148 may be disposed between the first dielectric layer 146 and the second dielectric layer 150, and the second dielectric layer 150 may contact the channel layer 153.

In an example, the data storage layer 148 may include regions in which information may be stored in a memory device such as a NAND flash memory device. For example, the data storage layer 148 stores areas which may store information, between the channel layer 153 and the intermediate gate layers 137M, which may be the word lines (WL in FIG. 1) among the horizontal layers 137. The data storage layer 148 may be formed of a material capable of storing information by trapping charges in a flash memory device. The data storage layer 148 may be formed of, e.g., silicon nitride. In an example embodiment, the silicon nitride of the data storage layer 148 may be replaced with another material capable of storing information.

In an example, the channel layer 153 may include a first channel region 153*a* and a second channel region 153*b*. The first channel region 153*a* may be an undoped region, and the second channel region 153*b* may be a doped region having N-type conductivity. The channel layer 153 may be formed of, e.g., a silicon layer. The first channel region 153*a* may be located below the second channel region 153*b*.

The first channel region 153*a* may at least face the intermediate gate layers 137M, and the second channel region 153*b* may at least face the second upper gate layer 137U2. In an example, the first upper gate layer 137U1 may face the first channel region 153*a*.

Figure 4:
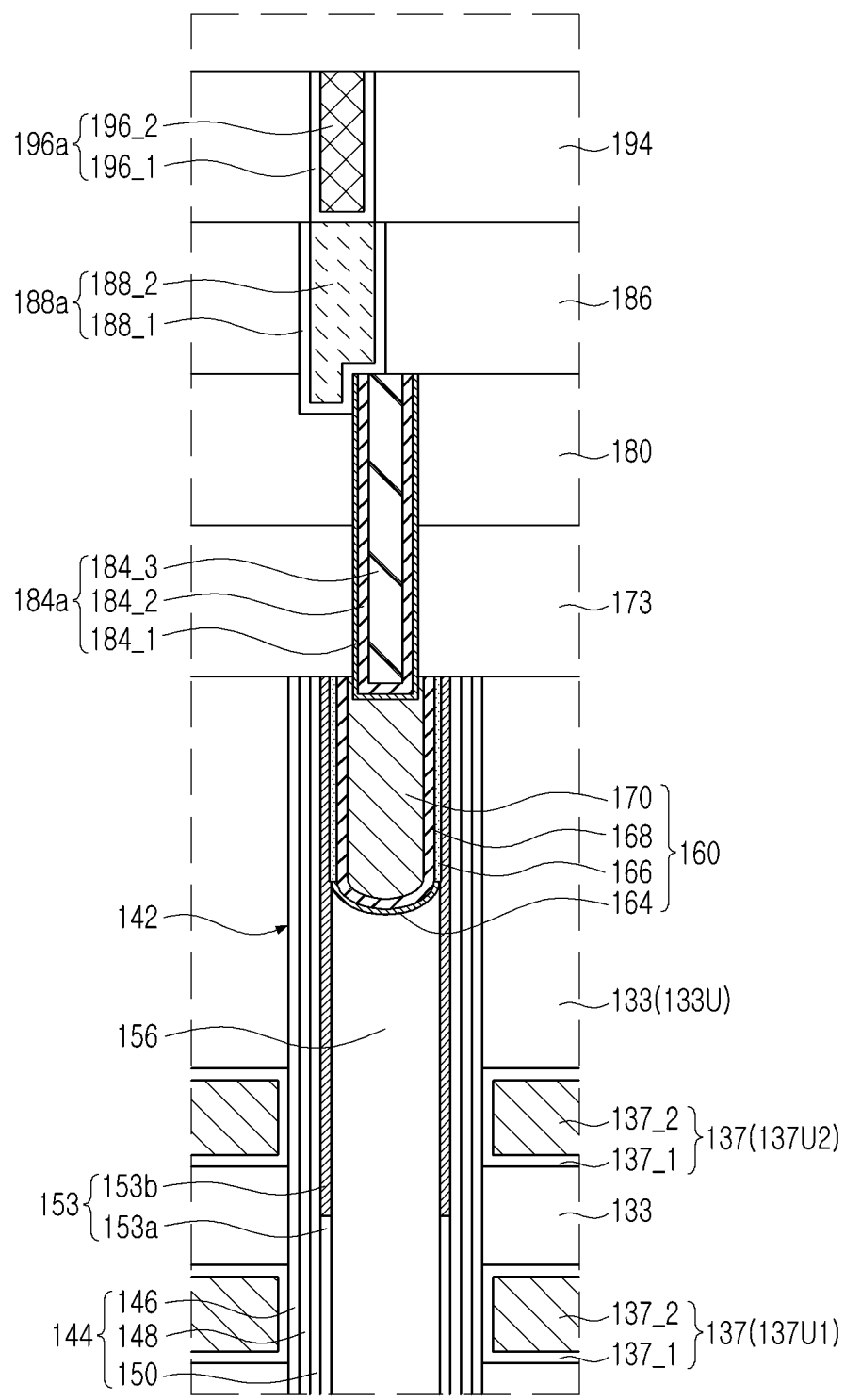
FIG. 4 is a partially enlarged cross-sectional view of FIG. 3.

Next, referring to FIG. 4, the pad pattern 160 of the vertical structure 142, the lower bit line contact plug 184*a*, the upper bit line contact plug 188*a*, and the conductive line 196*a* will be described. FIG. 4 is a partially enlarged view of portion "C" in FIG. 3.

Referring to FIG. 4, the pad pattern 160 may include a pad metal pattern 170 on the core region 156, a pad barrier layer 168 in contact with a side surface and a bottom surface of the pad metal pattern 170, and a pad metal-semiconductor compound layer 166 in contact with the pad barrier layer 168. The core region 156 may be formed of an insulating material, e.g., silicon oxide.

In an example, the pad pattern 160 may further include a pad metal layer 164 disposed between the pad barrier layer 168 and the core region 156. The pad metal-semiconductor compound layer 166 may be disposed between the second channel region 153b of the channel layer 153 and the pad barrier layer 168.

In an example, the pad metal layer 164 may be formed of a metal capable of forming the pad metal-semiconductor compound layer 166. For example, the pad metal layer 164 may include a metal, e.g., Ti, Ta, or W, and the pad metal-semiconductor compound layer 166 may be formed of a compound of a metal material, e.g., Ti, Ta, or W, and a semiconductor material, e.g., Si, Ge or SiGe. For example, the pad metal-semiconductor compound layer 166 may be, e.g., TiSi, TiGe, or TiSiGe layer.

In an example, the pad barrier layer 168 may include a metal nitride, e.g., TiN, TaN, or WN, and the pad metal pattern 170 may include a metal, e.g., W, etc.

In an example, the pad pattern 160, the channel layer 153, and the dielectric structure 144 may have upper surfaces positioned at substantially the same height level.

The lower bit line contact plug 184a may include the first lower plug layer 184_1, the second lower plug layer 184_2, and the lower plug pattern 184_3, as described with reference to FIGS. 2B and 2C. The first lower plug layer 184_1 of the lower bit line contact plug 184a may contact the pad pattern 160.

In an example, a portion of the upper surface of the lower bit line contact plug 184a contacts the third upper insulating layer 186, and the rest of the upper surface of the lower bit line contact plug 184a may contact the upper bit line contact plug 188a. The upper bit line contact plug 188a may contact a portion of a side surface of the lower bit line contact plug 184a.

The upper bit line contact plug 188a may be formed of the same material as the first peripheral upper contact plug 188b, the upper gate contact plug 188c, the second peripheral upper contact plug 188d, the third peripheral upper contact plug 188e, and the fourth peripheral upper contact plug 188f as described above. For example, the upper bit line contact plug 188a may include an upper barrier layer 188_1 including metal nitride, e.g., TiN, etc., and an upper plug pattern 188_2 including a metal, e.g., W, etc. The upper barrier layer 188_1 may cover a side surface and a bottom surface of the upper plug pattern 188_2.

The conductive line 196a, e.g., the bit line, may be formed of the same material as the gate connection wiring 196b, the peripheral connection wiring 196c, and the source connection wiring 196d described with reference to FIG. 2B. For example, the bit line 196a may include a barrier layer 196_1 including a metal nitride, e.g., TiN, etc., and a wiring pattern 196_2 including a metal, e.g., Cu, etc. The barrier layer 196_1 may cover a side surface and a bottom surface of the wiring pattern 196_2.

In an example, the pad metal pattern 170, the lower plug pattern 184_3, and the upper plug pattern 188_2 may include the same first metal, e.g., W, etc., and the wiring pattern 188_2 may include a second metal, e.g., Cu, different from the first metal.

Next, referring to FIG. 5, an example in which a plurality of the bit lines 196a are disposed, and planar shapes of the vertical structures 142 adjacent to each other, the lower bit line contact plugs 184a and the upper bit line contact plugs 188a, disposed on the vertical structures 142, respectively, will be described.

Figure 5:
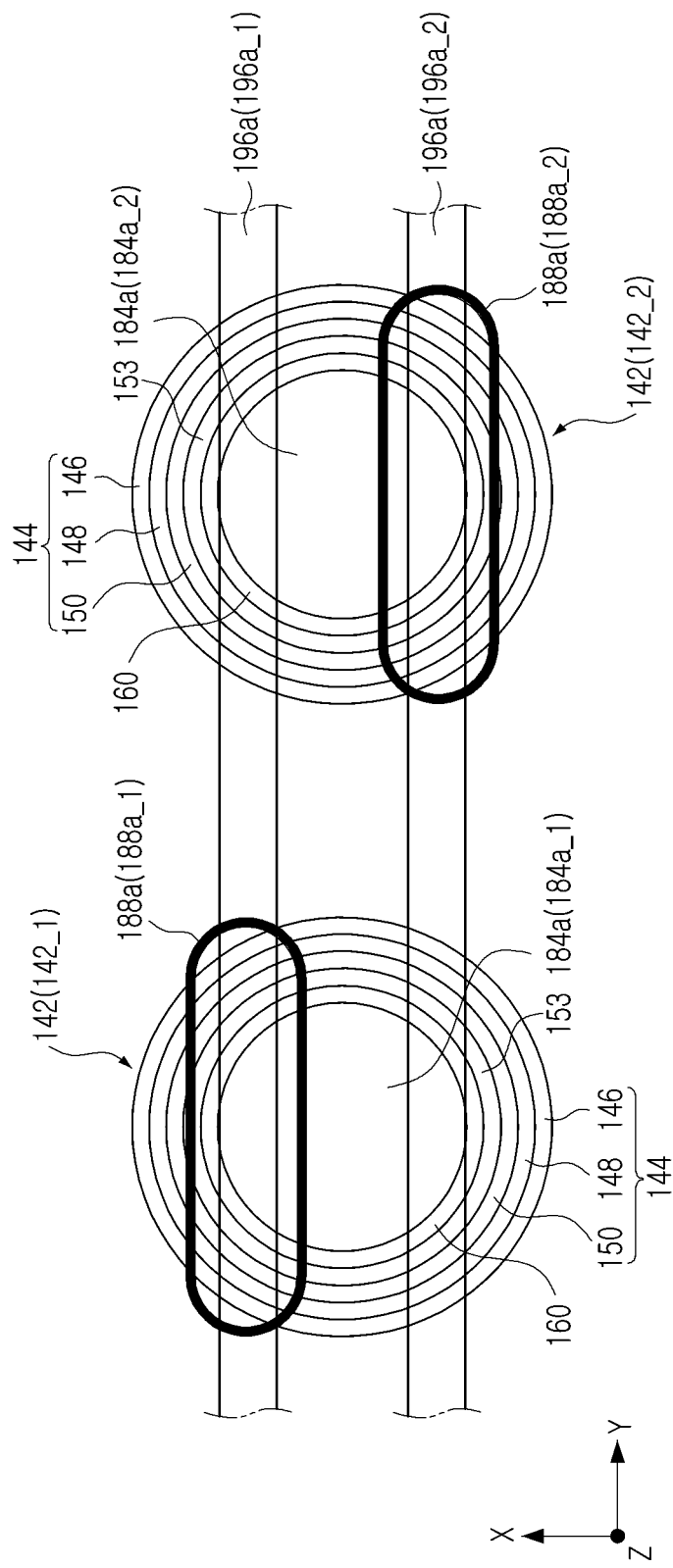
FIG. 5 is a plan view illustrating a portion of a memory device according to an example embodiment.

Referring to FIG. 5, the bit lines 196a may include a pair of first and second bit lines 196a_1 and 196a_2 parallel to each other. Each of the bit lines 196a may extend in the Y direction. The vertical structures 142 may include a pair of first and second vertical structures 142_1 and 142_2 adjacent to each other in the Y direction.

The lower bit line contact plugs 184a may include a first lower bit line contact plug 184a_1 overlapping the first vertical structure 142_1, and a second lower bit line contact plug 184a_2 overlapping the second vertical structure 142_2. The upper bit line contact plugs 188a may include a first upper bit line contact plug 188a_1 overlapping the first lower bit line contact plug 184a_1, and a second upper bit line contact plug 188a_2 overlapping the second lower bit line contact plug 184a_2. The first bit line 196a_1 may overlap the first upper bit line contact plug 188a_1, and the second bit line 196a_2 may overlap the second upper bit line contact plug 188a_2. In an example, a width of each of the lower bit line contact plugs 184a may be less than a width of each of the vertical structures 142.

In an example, each of the upper bit line contact plugs 188a may have a rectangular or elliptical shape having a first length in the Y direction and a second length (or a width) less than the first length in the X direction. In an example, in each of the upper bit line contact plugs 188a, the length in the Y direction may be greater than a width of each of the lower bit line contact plugs 184a, and the length in the X direction may be less than the width of each of the lower bit line contact plugs 184a.

Figure 6:
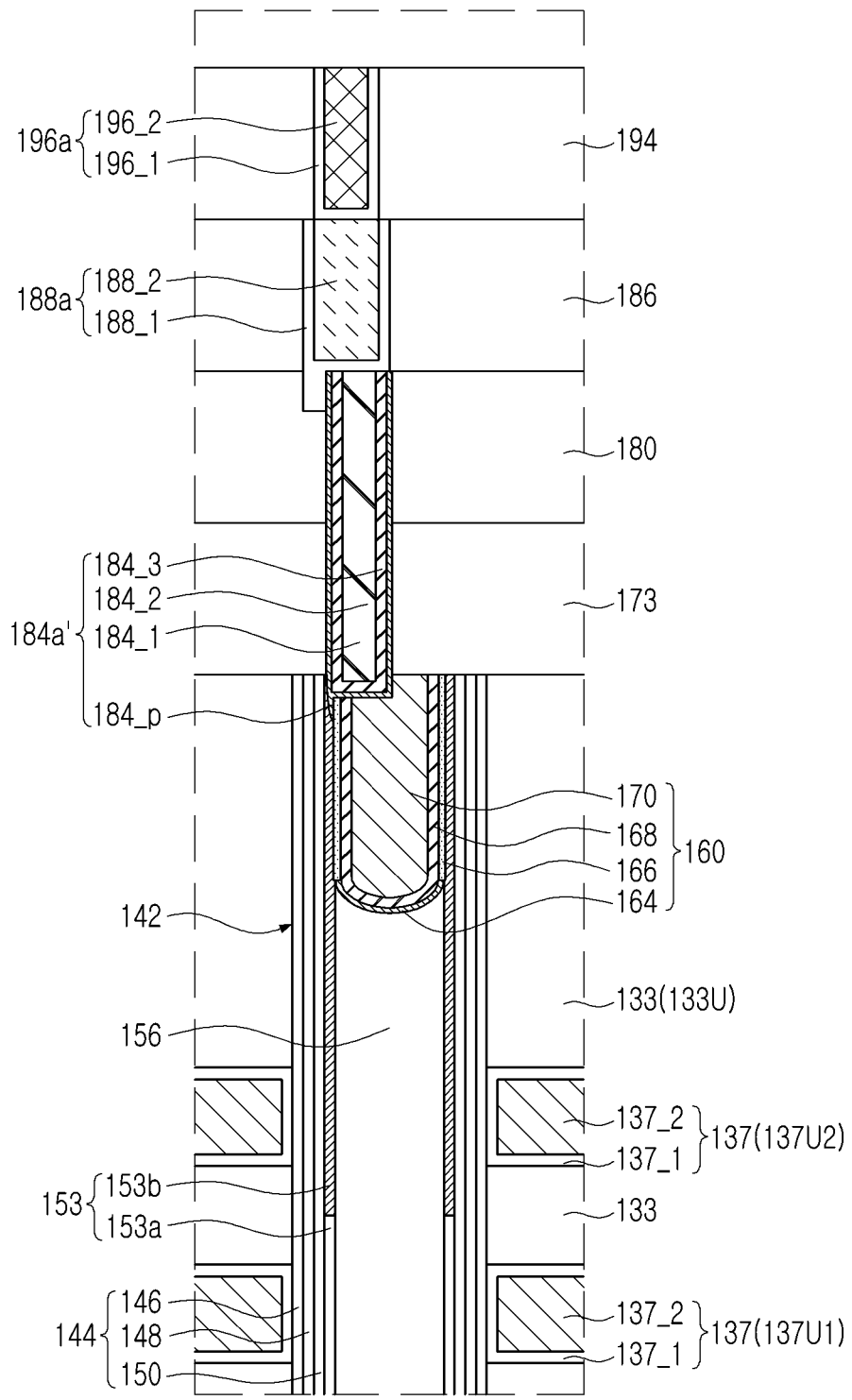
FIG. 6 is a partially enlarged cross-sectional view illustrating a modified example of a memory device according to an example embodiment.

Next, a modified example of the lower bit line contact plug 184a in FIG. 4 will be described with reference to FIG. 6. FIG. 6 is a partially enlarged view corresponding to the partially enlarged view of FIG. 4.

In a modified example, referring to FIG. 6, the lower bit line contact plug 184a in FIG. 4 may be replaced with a lower bit line contact plug 184a' overlapping the pad metal pattern 170 and the channel layer 153 positioned on one side of the pad metal pattern 170. The lower bit line contact plug 184a' may further include a lower extension portion 184_p extending into the channel layer 153, in a portion overlapping the channel layer 153. The lower bit line contact plug 184a' may be spaced apart from the dielectric structure 144.

Next, various modified examples of the pad pattern 160 described with reference to FIG. 4 will be described with reference to FIGS. 7A to 7E. FIGS. 7A to 7E are partially enlarged views respectively corresponding to the partially enlarged view of FIG. 4. Hereinafter, in the pad patterns in the modified examples described with reference to FIGS. 7A to 7E, the same reference numerals or the same terms as those of the constituent elements of the pad pattern 160 described with reference to FIG. 4 refer to the same material as the constituent elements of the pad pattern 160 may be the same material as the constituent elements of the pad pattern 160 described with reference to FIG. 4. Accordingly, detailed descriptions of the same reference numerals or terms as those of the components of the pad pattern 160 described with reference to FIG. 4 will be omitted.

Figure 7A:
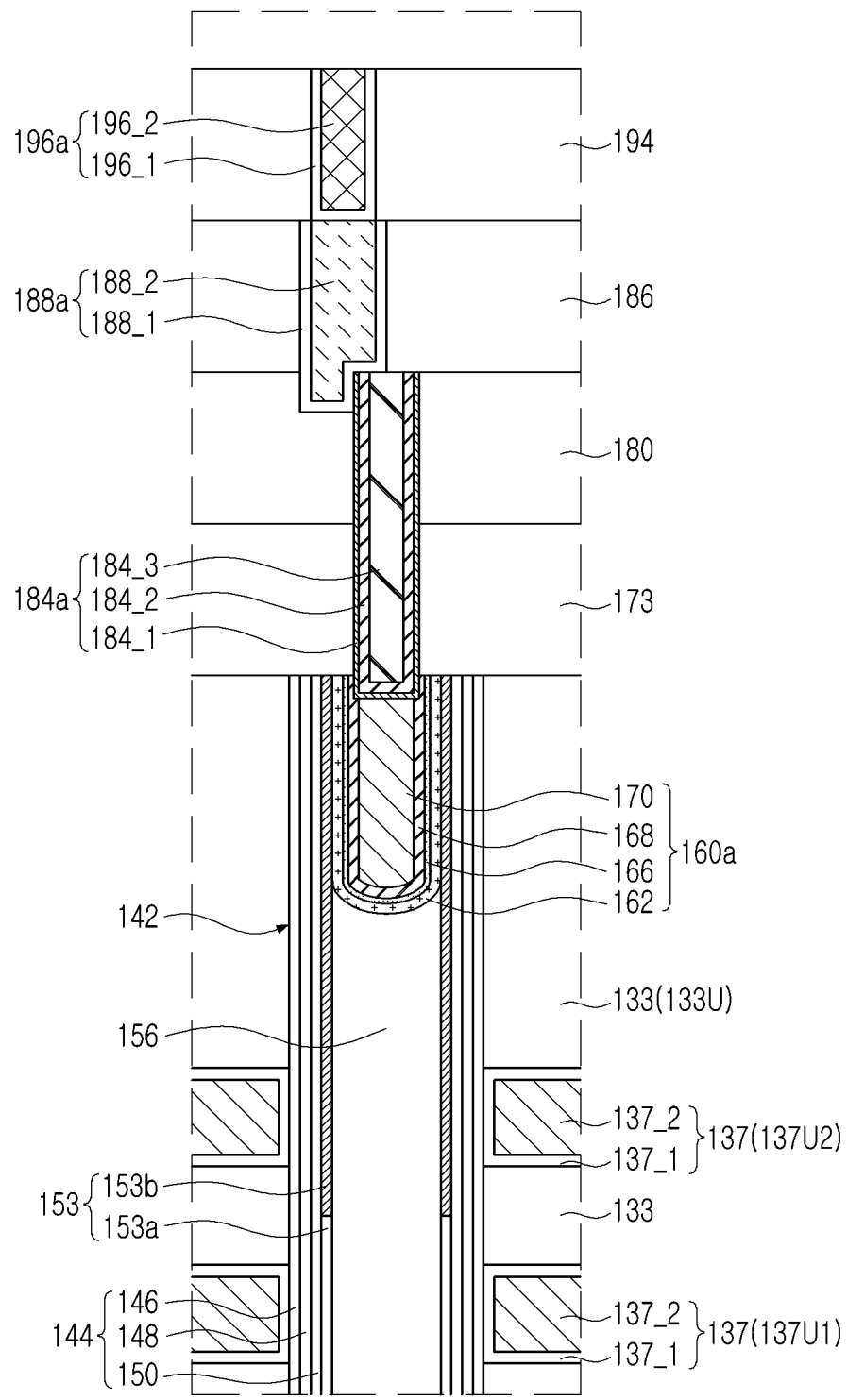
FIGS. 7A to 7E are partially enlarged cross-sectional views illustrating a modified example of a memory device according to an example embodiment.

In a modified example, referring to FIG. 7A, the pad pattern 160 in FIG. 4 may be replaced with a pad pattern 160a in FIG. 7A. The pad pattern 160a may include a pad metal pattern 170, a pad semiconductor layer 162 covering side and bottom surfaces of the pad metal pattern 170, a pad barrier layer 168 disposed between the pad semiconductor layer 162 and the pad metal pattern 170, and a pad metal-semiconductor compound layer 166 between the pad barrier layer 168 and the pad semiconductor layer 162. A semiconductor layer 162 and 153 may include the pad semiconductor layer 162 and the channel layer 153. The pad semiconductor layer 162 may include a first portion contacting the channel layer 153 and a second portion contacting the core region 156. For example, the first portion of the pad semiconductor layer 162 may contact the second channel region 153b of the channel layer 153. The second channel region 153b may be a doped region having N-type conductivity.

In an example, the pad semiconductor layer 162 may have a same conductivity type as the second channel region 153b. For example, the pad semiconductor layer 162 may have N-type conductivity. In an example, the pad semiconductor layer 162 may include at least one of, e.g., a Si layer, a Ge layer, and a SiGe layer.

Figure 7B:
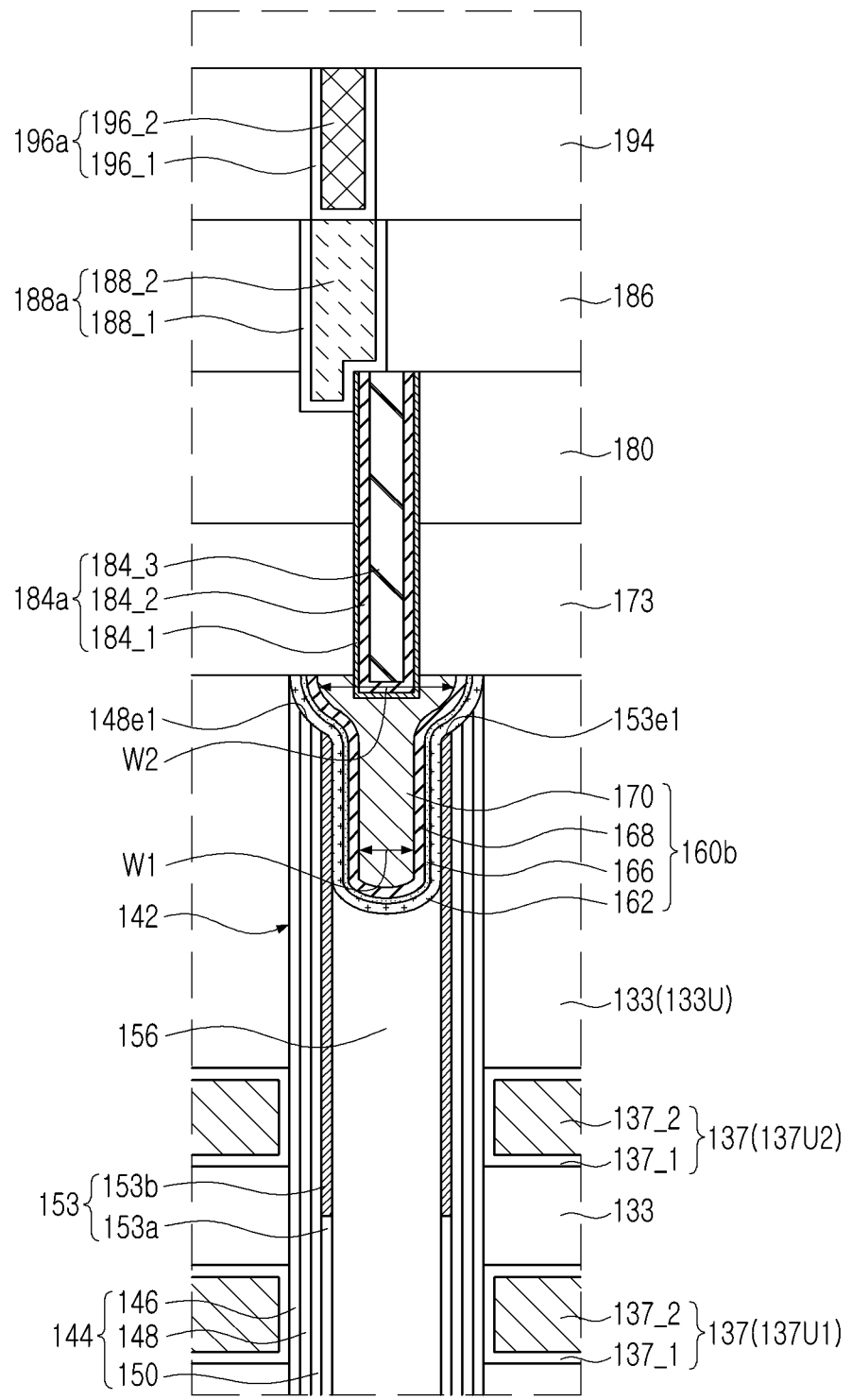

In a modified example, referring to FIG. 7B, the pad pattern 160 in FIG. 4 may be replaced with a pad pattern 160b in FIG. 7B. The pad pattern 160b may include a pad metal pattern 170, a pad semiconductor layer 162 covering side and bottom surfaces of the pad metal pattern 170, a pad barrier layer 168 disposed between the pad semiconductor layer 162 and the pad metal pattern 170, and a pad metal-semiconductor compound layer 166 between the pad barrier layer 168 and the pad semiconductor layer 162.

In the pad pattern 160b, the pad metal pattern 170 may include a first width portion W1, and a second width portion W2 having a width greater than the first width portion W1 on the first width portion W1. In the pad pattern 160b, a vertical length of the first width portion W1 may be less than a vertical length of the second width portion W2.

An upper surface of the dielectric structure 144 and an upper surface 153e1 of the channel layer 153 may contact the pad pattern 160b. An upper surface 148e1 of the data storage layer 148 and the upper surface 153e1 of the channel layer 153 may be positioned at a lower level than the upper surface of the pad pattern 160b.

Figure 7C:
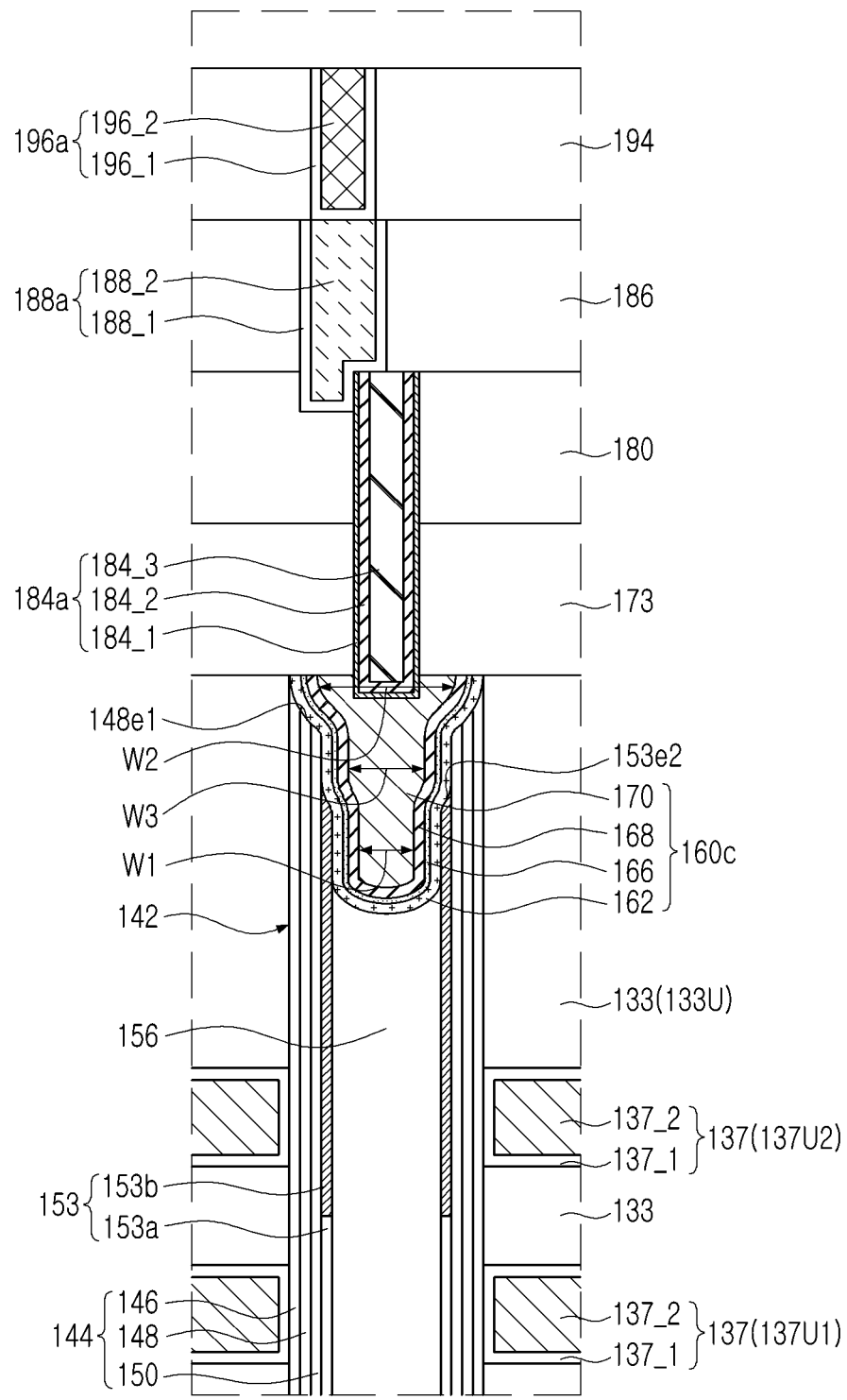

In a modified example, referring to FIG. 7C, the pad pattern 160b of FIG. 7B may be replaced with a pad pattern 160c of FIG. 7C. The pad pattern 160c may include a pad metal pattern 170, a pad semiconductor layer 162 covering side and bottom surfaces of the pad metal pattern 170, a pad barrier layer 168 disposed between the pad semiconductor layer 162 and the pad metal pattern 170, and a pad metal-semiconductor compound layer 166 between the pad barrier layer 168 and the pad semiconductor layer 162.

In the pad pattern 160c, the pad metal pattern 170 may include a first width portion W1, a second width portion W2 having a width greater than a width of the first width portion W1 on the first width portion W1, and a third width portion W3 between the first width portion W1 and the second width portion W2. The third width portion W3 may have a width greater than the first width portion W1 and less than the second width portion W2.

A side surface of the second width portion W2 may be inclined, and a side surface of at least one of the first width portion W1 and the third width portion W3 may be substantially vertical. Accordingly, a side surface of the second width portion W2 and a side surface of at least one of the first width portion W1 and the third width portion W3 may have different inclinations.

The upper surface of the dielectric structure 144 and the upper surface 153e1 of the channel layer 153 may contact the pad pattern 160c. The upper surface 148e1 of the data storage layer 148 and the upper surface 153e1 of the channel layer 153 may be positioned at a lower level than the upper surface of the pad pattern 160b. The upper surface 153e1 of the channel layer 153 may be positioned at a lower level than the upper surface 148e1 of the data storage layer 148. In the pad pattern 160c, the pad semiconductor layer 162 may contact the upper surface 153e1 of the channel layer 153, and may contact a portion of an inner side surface of the dielectric structure 144 and an upper surface of the dielectric structure 144.

Figure 7D:
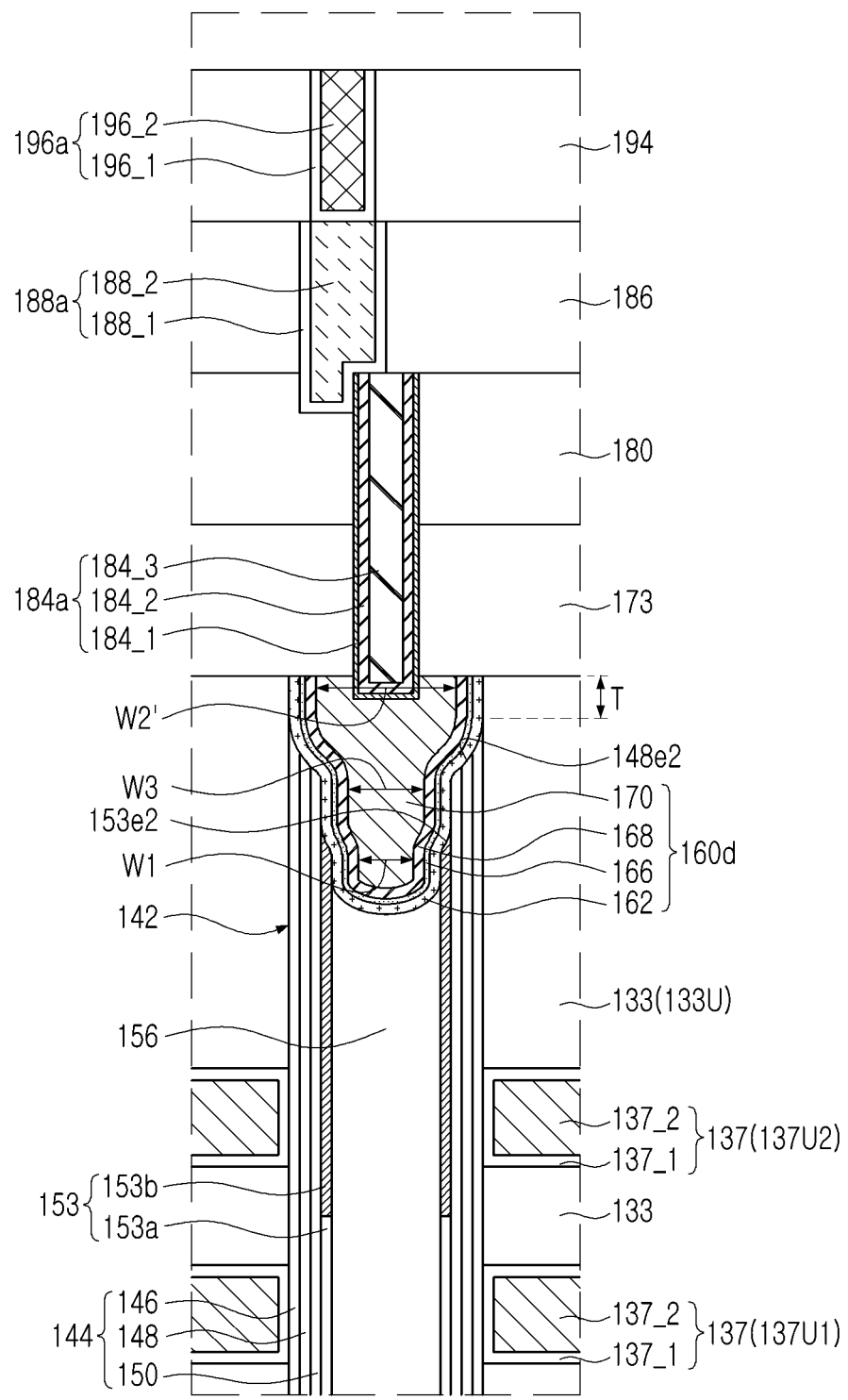

In a modified example, referring to FIG. 7D, the pad pattern 160c of FIG. 7C may be replaced with a pad pattern 160d of FIG. 7D. The second width portion W2 having an inclined side surface in FIG. 7C may be replaced with a second width portion W2' having a substantially vertical side surface as in FIG. 7D. Accordingly, the pad pattern 160d may have a second width portion W2'.

In the pad pattern 160d, the second width portion W2' may have a constant thickness T. The thickness T of the second width portion W2' may be greater than the thickness of the channel layer 153 or the thickness of the data storage layer 148. The thickness T of the second width portion W2' may be greater than the thickness of the dielectric structure 144.

Figure 7E:
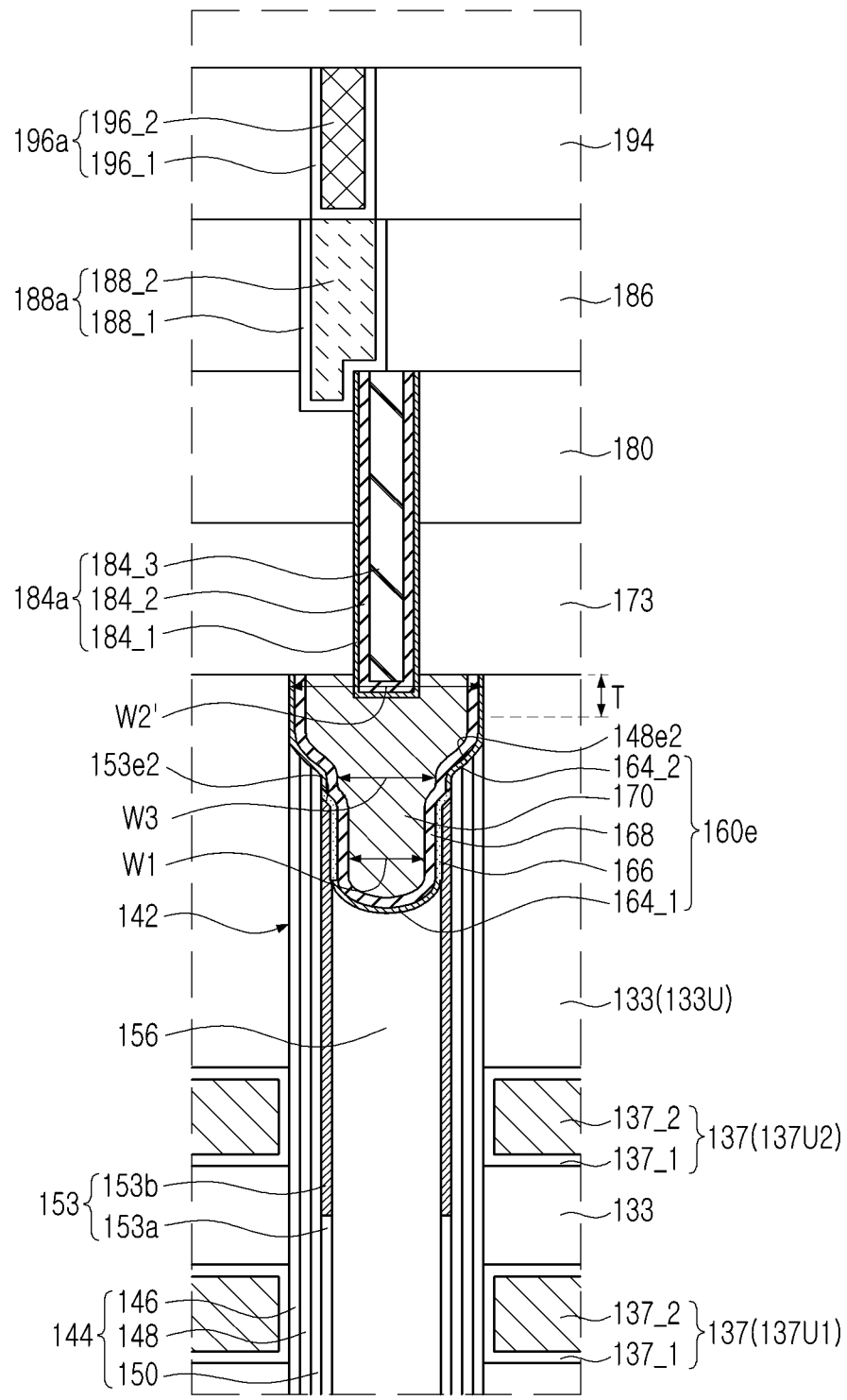

In a modified example, referring to FIG. 7E, the pad pattern 160d in FIG. 7D may be replaced with a pad pattern 160e in FIG. 7E. The pad pattern 160e may include a pad metal pattern 170, a pad barrier layer 168 covering side and bottom surfaces of the pad metal pattern 170, a pad metal-semiconductor compound layer 166 between the pad barrier layer 168 and the channel layer 153, a first pad metal layer 164_1 between the pad barrier layer 168 and the core region 156, and a second pad metal layer 164_2 extending from an upper end of the pad metal-semiconductor compound layer 166 to cover a side surface of the pad barrier layer 168.

The first and second pad metal layers 164_1 and 164_2 may be formed of the same material as the pad metal layer 164 described with reference to FIG. 4. The upper surface 153e3 of the channel layer 153 may contact the pad metal-semiconductor compound layer 166, and the upper surface of the dielectric structure 144 may contact the second pad metal layer 164_2.

In the pad pattern 160e, the pad metal pattern 170 may include a first width portion W1, a second width portion W2' and a third width portion W3, having a size relationship similar to that of the pad metal pattern 170 in FIG. 7D.

Figure 8:
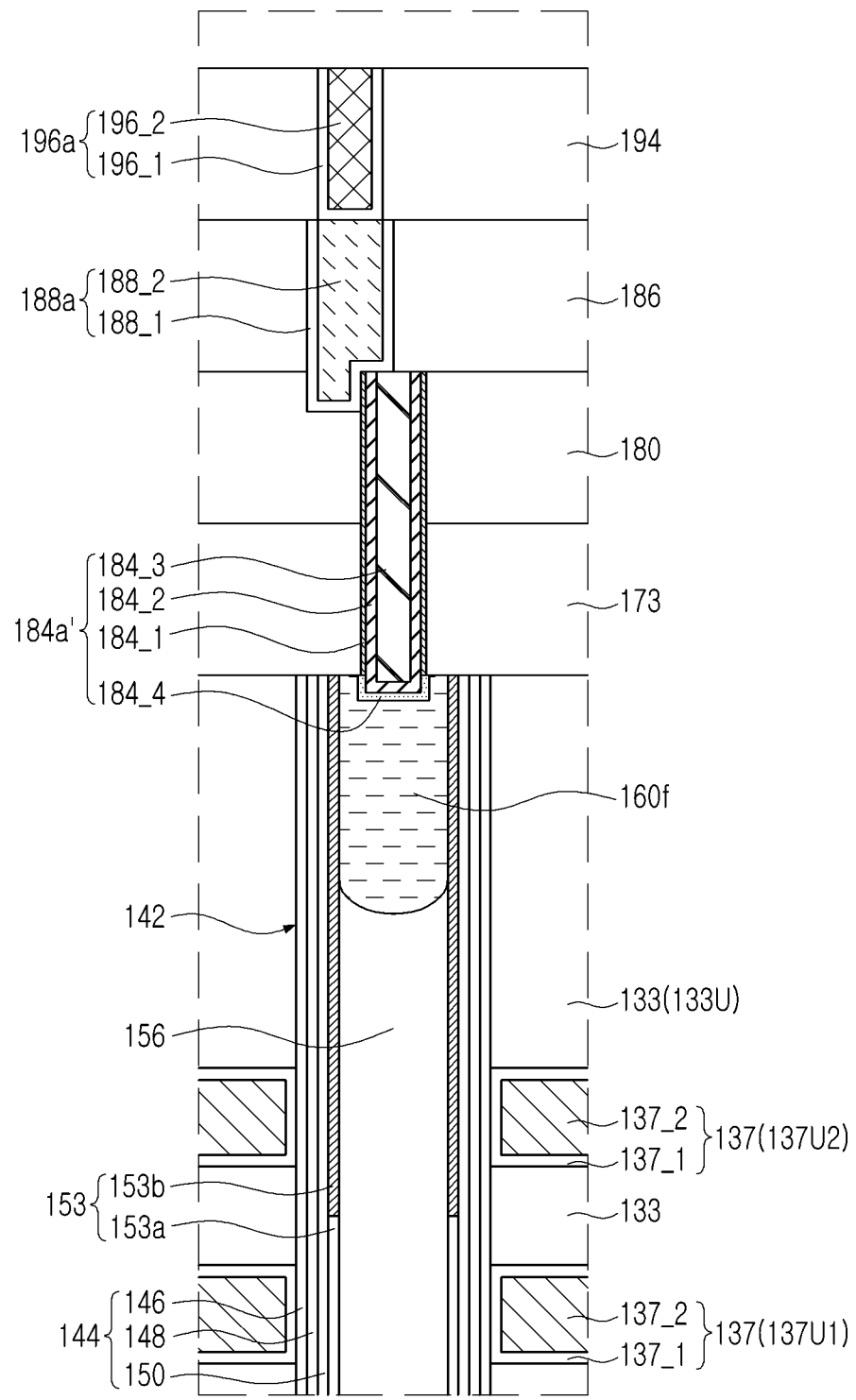
FIG. 8 is a partially enlarged cross-sectional view illustrating a modified example of a memory device according to an example embodiment.

Next, a modified example of the pad pattern 160 and the lower bit line contact plug 184a described with reference to FIG. 4 will be described with reference to FIG. 8.

In a modified example, referring to FIG. 8, the pad pattern 160 described with reference to FIG. 4 may be replaced with a pad pattern 160f as in FIG. 8. The pad pattern 160f may be formed of a pad semiconductor layer having N-type conductivity. The lower bit line contact plug 184a described with reference to FIG. 4 may be replaced with a lower bit line contact plug 184a' as illustrated in FIG. 8.

The lower bit line contact plug 184a' may further include a metal-semiconductor compound layer 184_4, compared with the lower bit line contact plug 184a illustrated in FIG. 4. For example, the lower bit line contact plug 184a' may further include the lower plug pattern 184_3, a second lower plug layer 184_2 covering side and bottom surfaces of the lower plug pattern 184_3, a first lower plug layer 184_1 on an outer side surface of the second lower plug layer 184_2, and the metal-semiconductor compound layer 184_4 extending from the first lower plug layer 184_1 and disposed between the second lower plug layer 184_2 and the pad pattern 160f. The lower bit line contact plug 184a' may extend into the pad pattern 160f.

Figure 9:
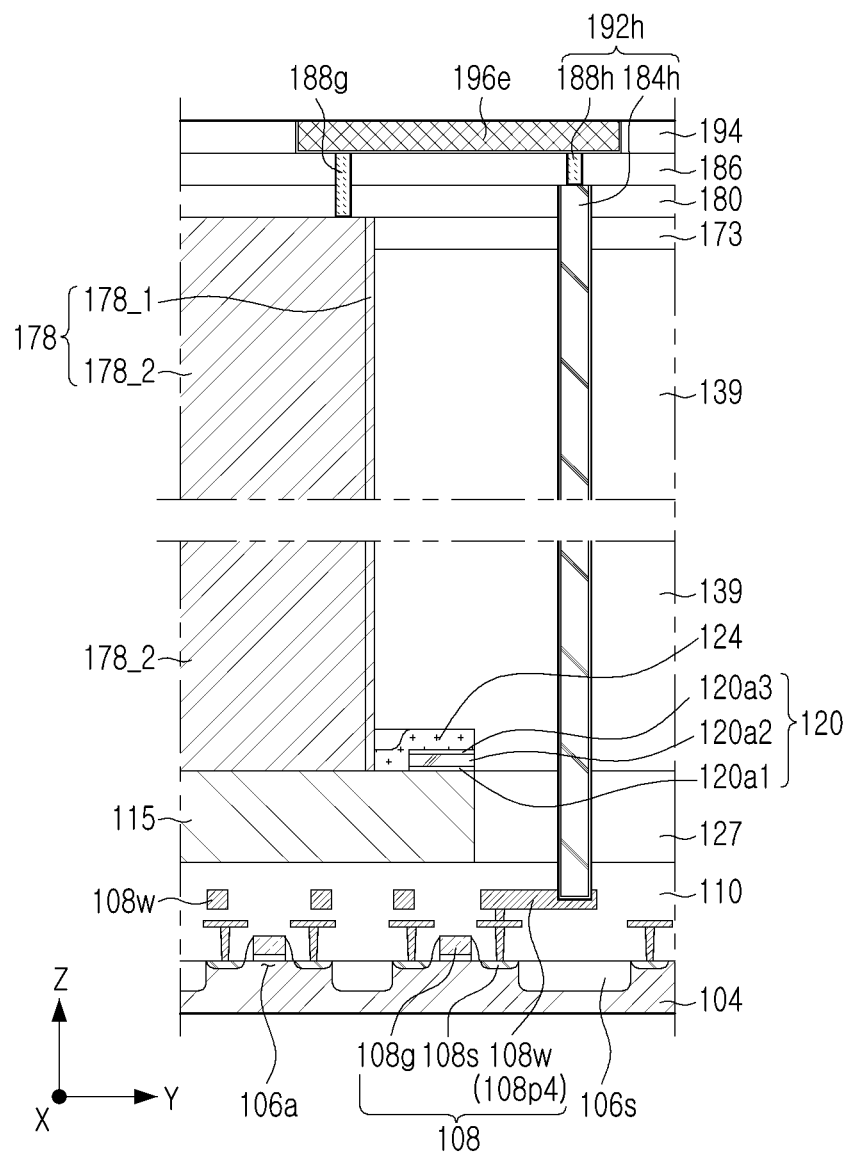
FIG. 9 is a cross-sectional view illustrating a memory device according to an example embodiment.

Again, referring to FIG. 2A, the separation structure 178 may have a linear shape extending in the X direction. Hereinafter, a cross-sectional structure in which the separation structure 178 is cut in the X direction will be described with reference to FIG. 9. FIG. 9 illustrates a cross-sectional structure of the separation structure 178 cut in the X direction.

Referring to FIGS. 2A and 9, an end portion of the separation structure 178 may be disposed on the pattern layer 115. In the separation structure 178, the second separation pattern 178_2 may be formed of a conductive material. The intermediate structure 120 and the upper horizontal connection layer 124 may be disposed on the pattern layer 115 that does not overlap the separation structure 178. The intermediate structure 120 may be spaced apart from the separation structure 178. The peripheral wiring 108w of the peripheral circuit 108 may further include a fourth peripheral pad 108p4.

In an example, the memory device 10 may further include a fifth peripheral contact structure 192h. The fifth peripheral contact structure 192h may include a fifth peripheral lower contact plug 184h and a fifth peripheral upper contact plug 188h that are sequentially stacked.

The fifth peripheral lower contact plug 184h is in contact with and electrically connected to the fourth peripheral pad 108p4, and extends upward to penetrate through the intermediate insulating layer 127, the capping insulating layer 139, and the first and second upper insulating layers 173 and 708.

The fifth peripheral lower contact plug 184h may be formed of substantially the same structure and material as the third peripheral lower contact plug (184e in FIG. 2B), and the fifth peripheral upper contact plug 188h may be formed of substantially the same structure and the same material as the third peripheral upper contact plug (188e in FIG. 2B).

In an example, the memory device 10 may further include a sixth peripheral upper contact plug 188g that is in contact with and electrically connected to the second separation pattern 178_2, on the separation structure 178. The sixth peripheral upper contact plug 188g may be formed of the same material as the fifth peripheral upper contact plug 188h.

In an example, the memory device 10 may further include a connection wiring 196e that is in contact with and electrically connected to the sixth peripheral upper contact plug 188g and the fifth peripheral upper contact plug 188h. The connection wiring 196e may be formed of the same structure and material as the bit line 196a at the same height level as the bit line 196a.

Next, an example of a method of forming a memory device according to an example embodiment will be described with reference to FIGS. 10A to 13B. In FIGS. 10A to 13B, FIGS. 10A, 11A, 12A and 13A are cross-sectional views illustrating stages in a method of forming the cross-sectional structure of FIG. 2A, and FIGS. 10B, 11B, 12B and 13B are cross-sectional views illustrating stages in a method of forming a cross-sectional structure of FIG. 2B, and FIG. 10C is a partially enlarged view of portion "B'" in FIG. 10B. Accordingly, in the following, descriptions overlapping with the content described with reference to FIGS. 2A and 2B will be omitted, and a schematic method of forming the cross-sectional structure of FIGS. 2A and 2B will be described.

Figure 10A:
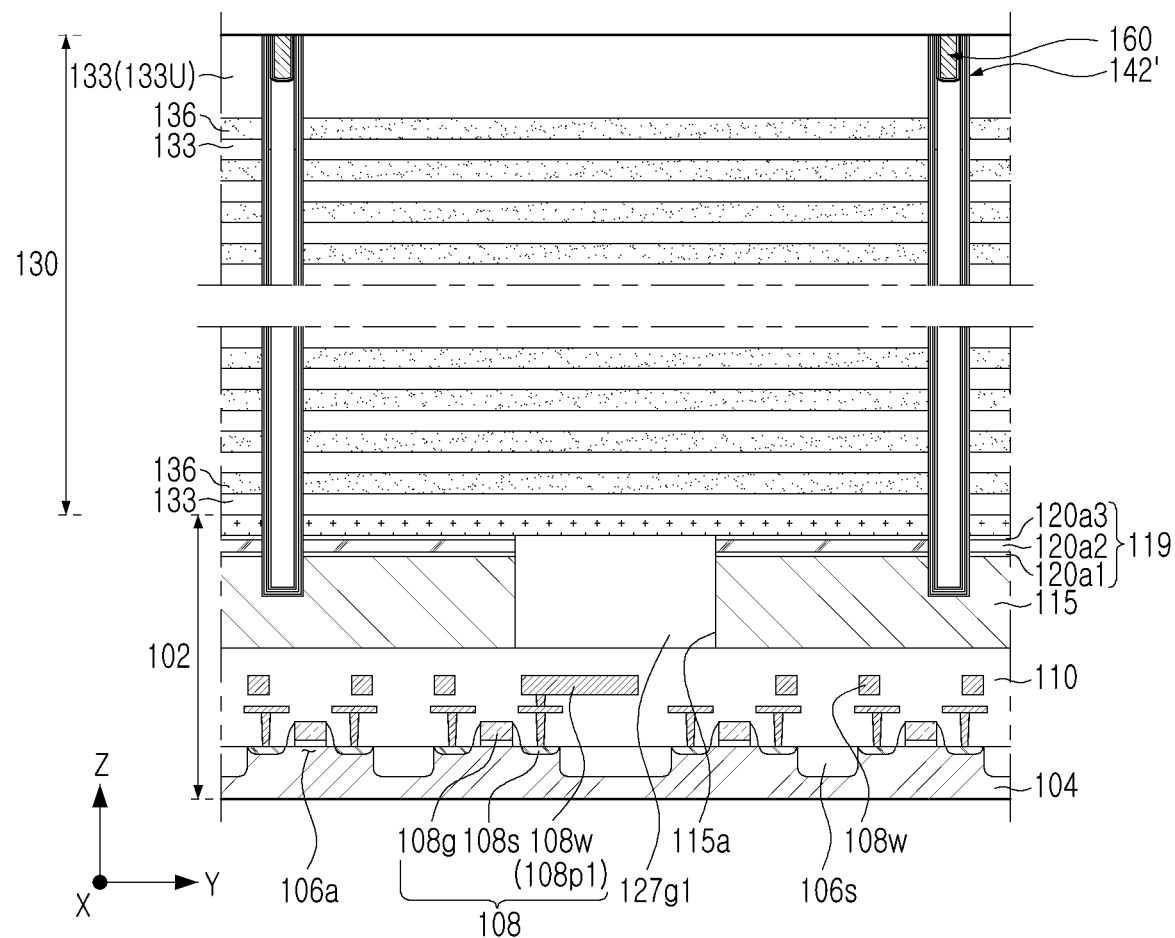
FIGS. 10A to 13B are cross-sectional views illustrating an example of a method of forming a memory device according to an example embodiment.
Figure 10B:
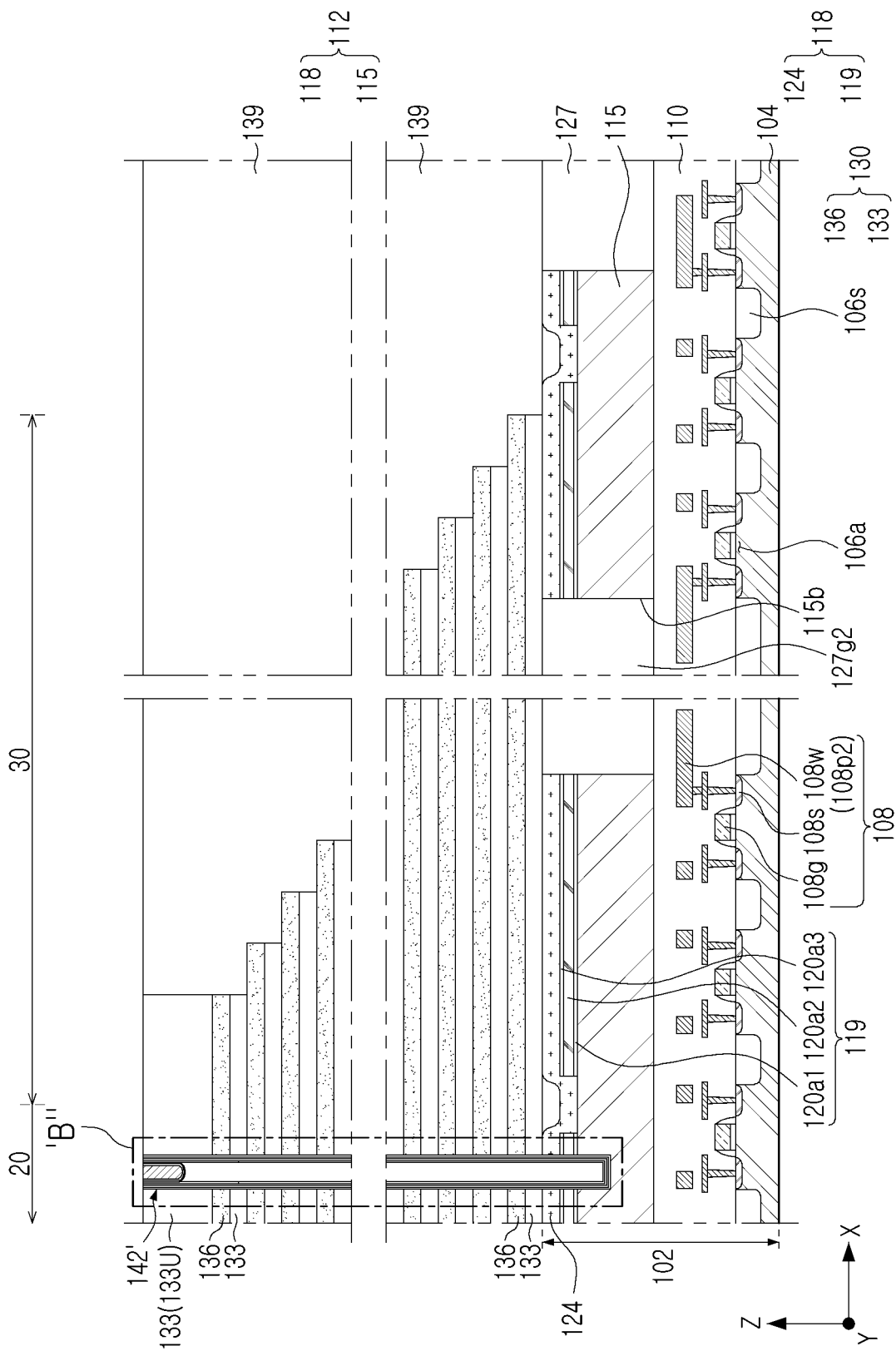
Figure 10C:
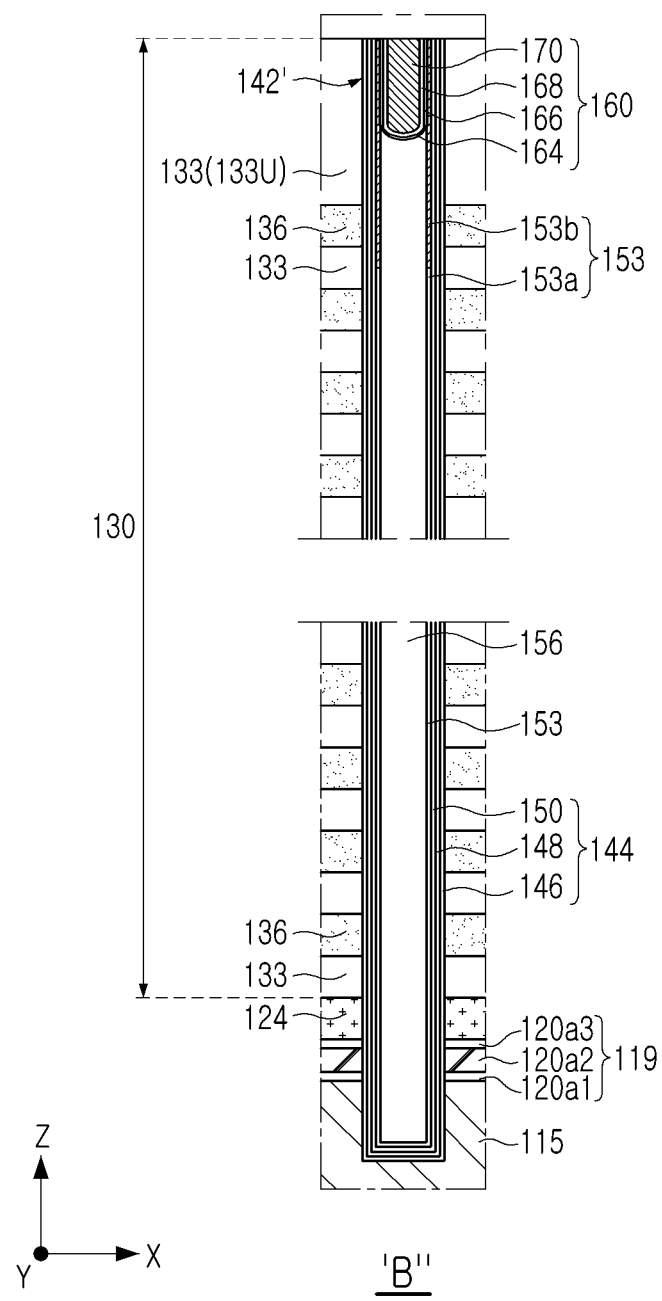

Referring to FIGS. 10A, 10B and 10C, a lower structure 102 may be formed.

Forming the lower structure 102 may include preparing a substrate 104 and forming a peripheral circuit 108 and a lower insulating layer 110 on the substrate 104. The peripheral circuit 108 may include a peripheral gate 108g, a peripheral source/drain 108s, and a peripheral wiring 108w as described with reference to FIG. 2A. The lower insulating layer 110 may cover the peripheral circuit 108.

Forming the lower structure 102 may include forming a pattern structure 112 having a first opening 115a and a second opening 115b on the lower insulating layer 110, forming an insulating layer, and planarizing the insulating layer. The planarized insulating layer may be formed of a first gap-fill insulating layer 127g1 remaining in the first opening 115a, a second gap-fill insulating layer 127g2 remaining in the second opening 115b, and an intermediate insulating layer 127 remaining on an outer side surface of the pattern structure 112.

Forming the pattern structure 112 may include forming a pattern layer 115, forming an intermediate layer 119 having an opening, on the pattern layer 115, forming an upper horizontal connection layer 124 filling the opening and covering the intermediate layer 119, and forming the first and second openings 115a and 115b by patterning the pattern layer 115, the intermediate layer 119 and the upper horizontal connection layer 124. The intermediate layer 119 may include a first layer 120a1, a second layer 120a2, and a third layer 120a3 sequentially stacked. The intermediate layer 119 and the upper horizontal connection layer 124 may constitute a horizontal connection layer 118.

A preliminary stacked structure 130 may be formed on the lower structure 102. Forming the preliminary stacked structure 130 includes forming interlayer insulating layers 133 and preliminary horizontal layers 136, which are alternately and repeatedly stacked, and patterning the interlayer insulating layers 133 and the preliminary horizontal layers 136, thereby forming a stepped structure in the gate connection area 30 as described with reference to FIG. 2B. Subsequently, an insulating layer may be formed and the insulating layer may be planarized, thereby forming a capping insulating layer 139 having an upper surface coplanar with an uppermost interlayer insulating layer 133U among the interlayer insulating layers 133. The preliminary horizontal layers 136 may be formed of an insulating material, e.g., silicon nitride.

In the memory cell array area 20 as described with reference to FIGS. 2A and 2B, a vertical structure 142' that penetrates through the preliminary stacked structure 130 and extends into the pattern structure 112 may be formed. Forming the vertical structure 142' may include, in the memory cell array area 20, forming a channel hole extending into the pattern layer 115 while penetrating through the preliminary stacked structure 130, the upper horizontal connection layer 124, and the intermediate layer 119, forming a dielectric structure 144 conformally covering the inner wall of the channel hole, forming a conformal channel layer 153 on the dielectric structure 144, forming a core region 156 partially filling the channel hole, and forming a pad pattern 160 filling the remaining portion of the channel hole, on the core region 156. The pad pattern 160 may have the same structure as the structure described with reference to FIG. 5. In another example, the pad pattern 160 may have the same structure as any one of the pad patterns described with reference to FIGS. 7A to 7E and 8.

Figure 11A:
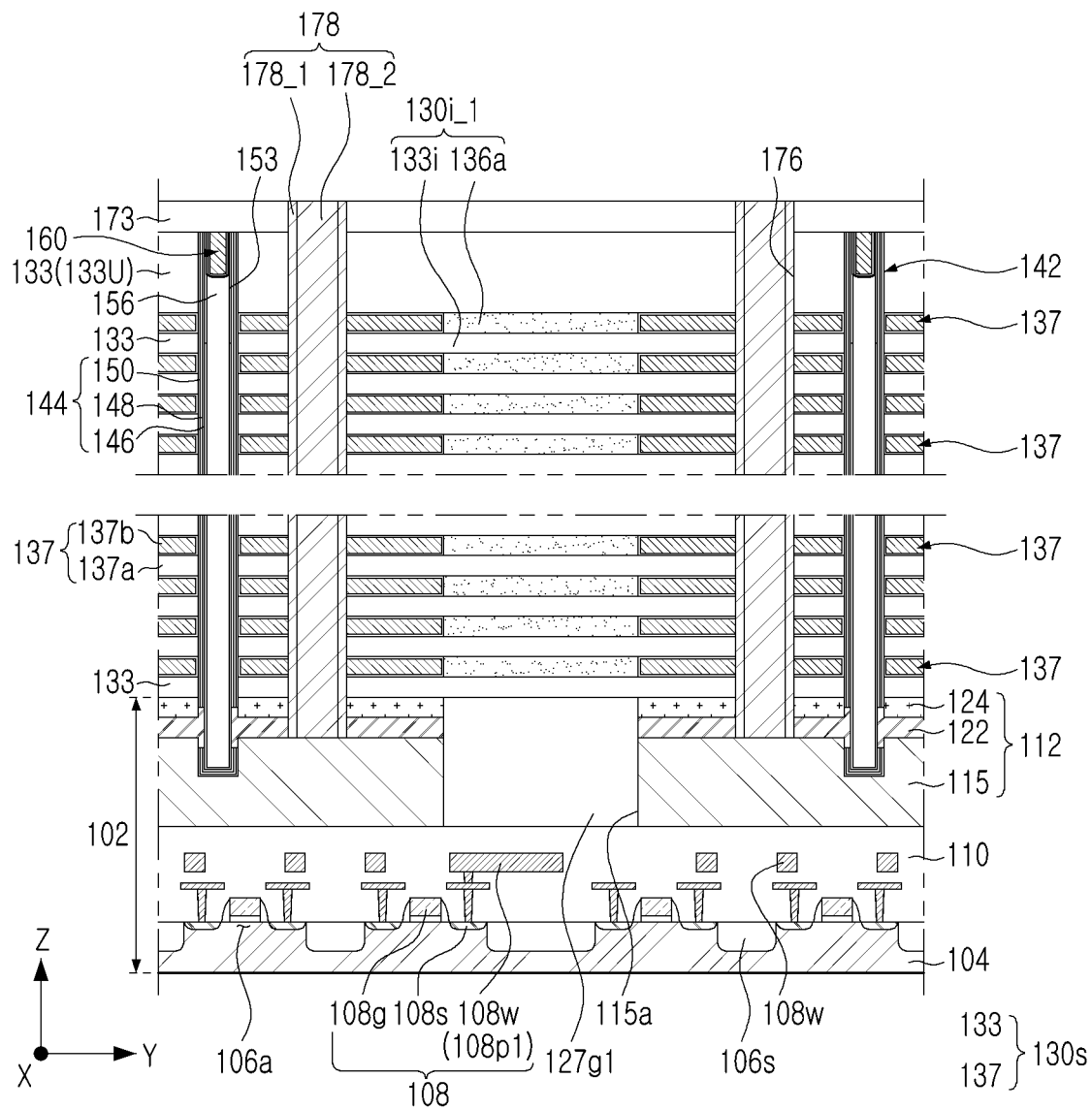
Figure 11B:
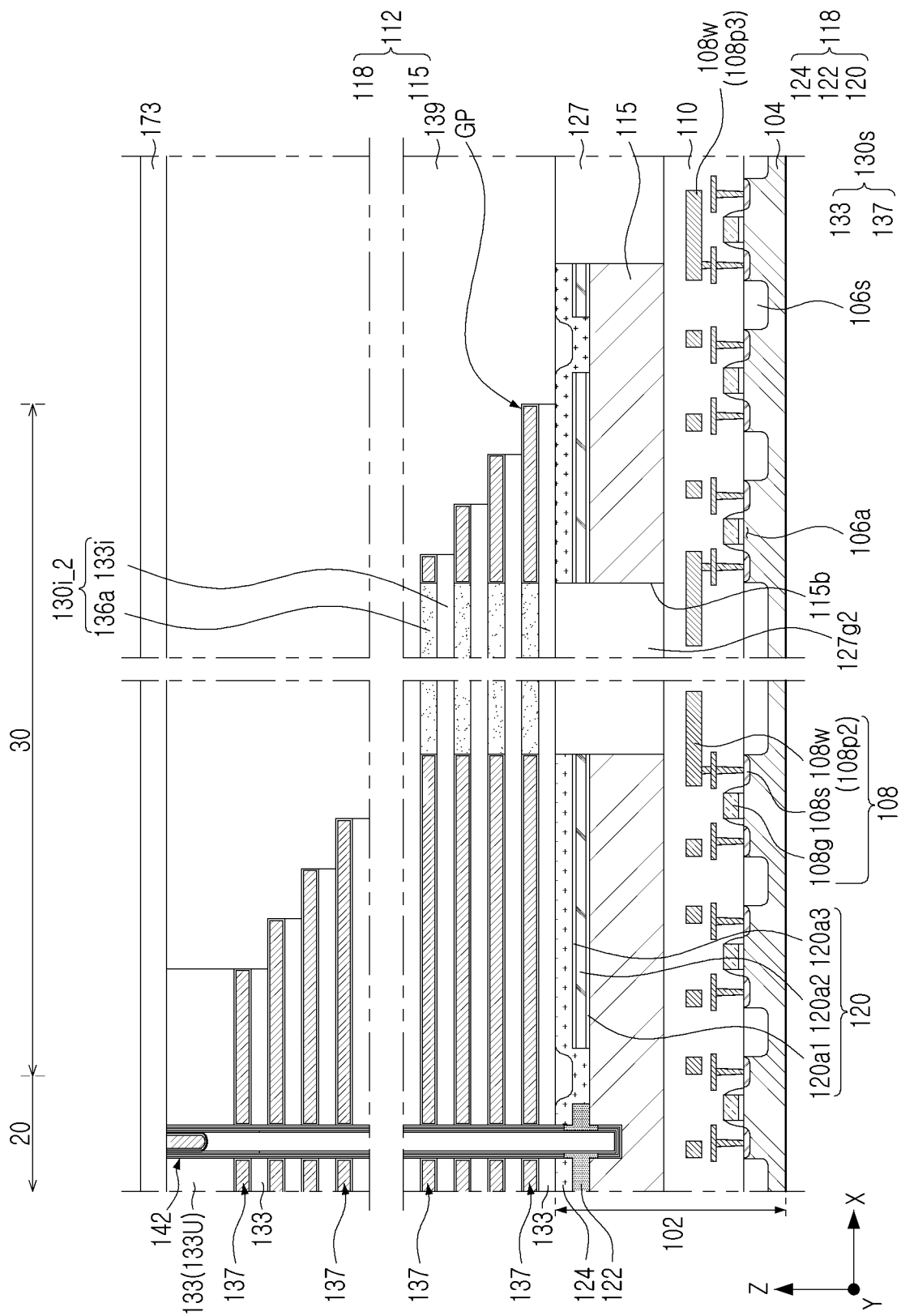

Referring to FIGS. 11A and 11B, a first upper insulating layer 173 may be formed on the preliminary stacked structure (130 of FIGS. 10A and 10B) and the capping insulating layer 139.

A trench 176 is formed to penetrate through the first upper insulating layer 173 and the preliminary stacked structure (130 of FIGS. 10A and 10B) and through the upper horizontal connection layer 124 and the intermediate layer (see FIGS. 10A and 10B), and is formed to extend into the pattern layer 115. The intermediate layer (FIGS. 10A and 10B) in the memory cell array area 20 is removed to form an opening exposing the side surface of the vertical structure (142' in FIGS. 10A and 10B), and the dielectric structure 144 of the vertical structure (142' in FIGS. 10A and 10B) exposed by the opening is etched to expose the channel layer 153, and a lower horizontal connection layer 122 filling the opening may be formed. Accordingly, the vertical structure 142 as described in FIGS. 2A and 2B may be formed.

After forming the lower horizontal connection layer 122, the preliminary horizontal layers 136 of the preliminary stacked structure (130 of FIGS. 10A and 10B) exposed by the trench 176 are partially etched to form an opening exposing a side surface of the vertical structure 142, and horizontal layers 137 filling the opening may be formed. The horizontal layers 137 may be the same as the horizontal layers described with reference to FIGS. 2A, 2B and 3. Accordingly, a stacked structure 130s including the horizontal layers 137 and the interlayer insulating layers 133 may be formed.

Portions of the preliminary horizontal layers 136 of the preliminary stacked structure (130 in FIGS. 10A and 10B) remain to form the insulating layers 136a of the first and second insulating regions 130i_1 and 130i_2 as described with reference to FIGS. 2A and 2B. Subsequently, a separation structure 178 filling the trench 176 may be formed. Forming the separation structure 178 may include forming a first separation pattern 178_1 on a side surface of the trench 176 and forming a second separation pattern 178_2 filling the trench 176.

Figure 12A:
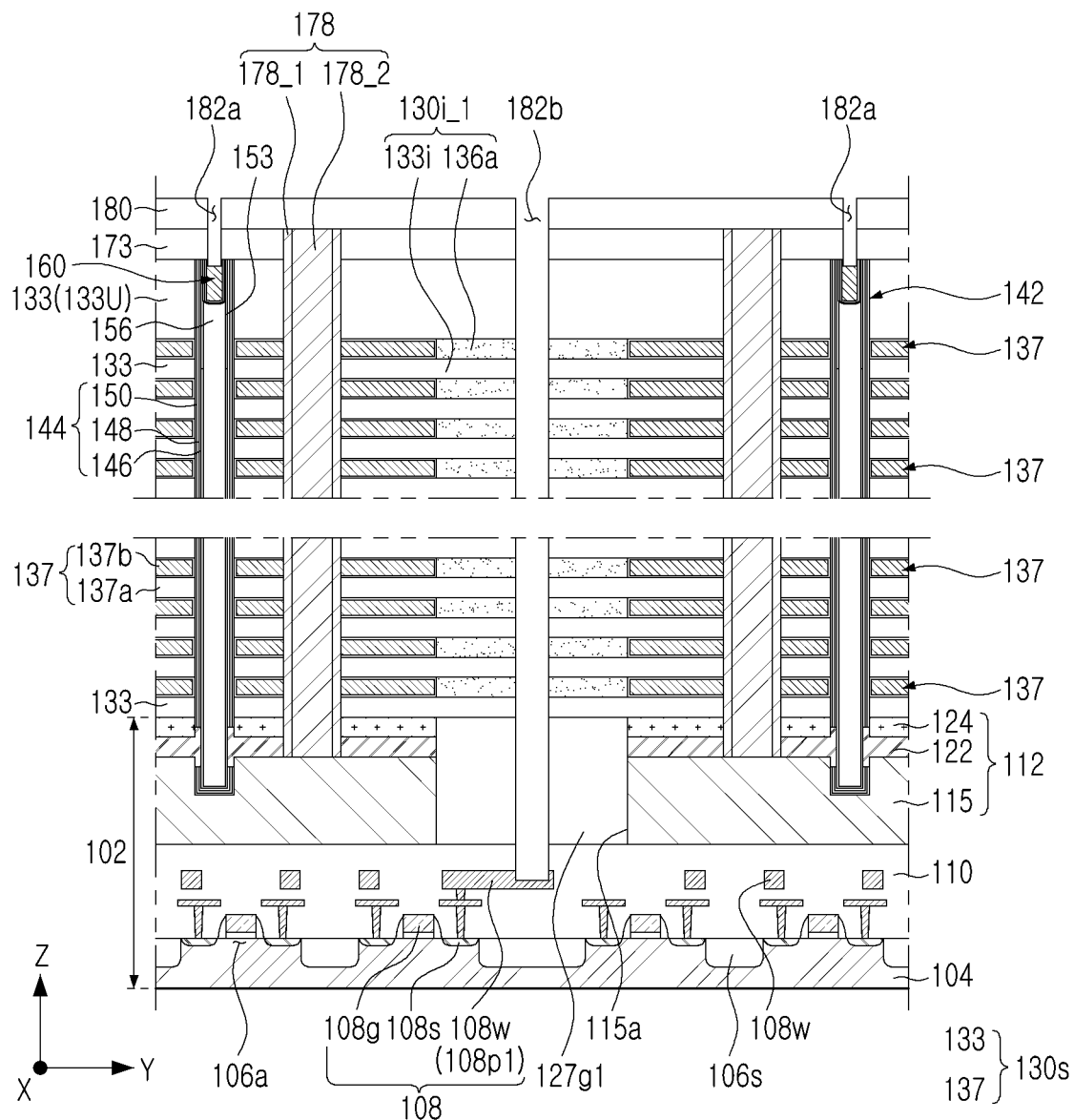
Figure 12B:
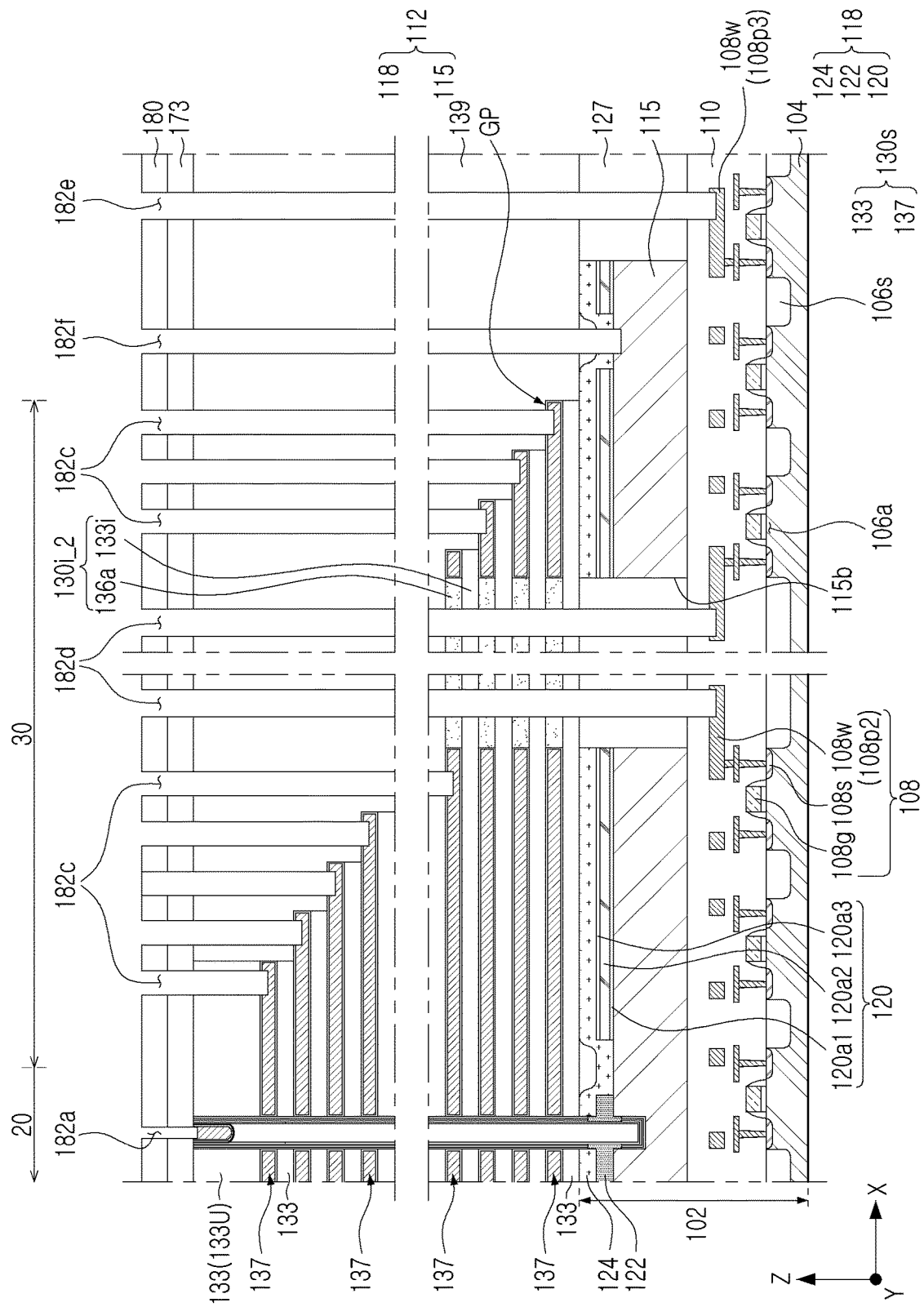

Referring to FIGS. 12A and 12B, a second upper insulating layer 180 may be formed on the first upper insulating layer 173. A lower bit line contact hole 182a, a first peripheral lower contact hole 182b, a lower gate contact hole 182c, a second peripheral lower contact hole 182d, a third peripheral lower contact hole 182e and a fourth peripheral lower contact hole 182f may be formed simultaneously with each other.

The lower bit line contact hole 182a may penetrate through the first and second upper insulating layers 173 and 180 and expose the pad pattern 160 of the vertical structure 142.

The first peripheral lower contact hole 182b may penetrate through the first and second upper insulating layers 173 and 180, the first insulating region 130i_1, and the first gap-fill insulating layer 127g1, and may extend into the lower insulating layer 110, and may expose a first peripheral pad 108p1 of the peripheral wiring 108w. The lower gate contact hole 182c may penetrate through the capping insulating layer 139 and the first and second upper insulating layers 173 and 180 and may expose gate pads GP of the horizontal layers 137. The second peripheral lower contact hole 182d may penetrate through the second insulating region 130i_2, the capping insulating layer 139, and the first and second upper insulating layers 173 and 180, and may expose a second peripheral pad 108p2 of the peripheral wiring 180w. The third peripheral lower contact hole 182e may penetrate through the intermediate insulating layer 127, the capping insulating layer 139, and the first and second upper insulating layers 173 and 180, and may expose a third peripheral pad 108p3 of the peripheral wiring 180w. The fourth peripheral lower contact hole 182f may penetrate through the capping insulating layer 139 and the first and second upper insulating layers 173 and 180, and may expose the pattern layer 115 and the upper horizontal connection layer 124 of the pattern structure 112.

The pad pattern 160 may include the pad metal pattern (170 in FIG. 4). Therefore, by forming the pad metal pattern (170 in FIG. 4) formed of a metal, damage to the channel layer 153 and the dielectric structure 144 may be prevented while the first peripheral lower contact hole 182b, the lower gate contact hole 182c, the second peripheral lower contact hole 182d, the third peripheral lower contact hole 182e and the fourth peripheral lower contact hole 182f are formed. Accordingly, the lower bit line contact hole 182a is formed simultaneously with the formation of the first peripheral lower contact hole 182b, the lower gate contact hole 182c, the second peripheral lower contact hole 182d, the third peripheral lower contact hole 182e and the fourth peripheral lower contact hole 182f, thereby increasing productivity.

In an example, while forming the lower bit line contact hole 182a with the first peripheral lower contact hole 182b, the lower gate contact hole 182c, the second peripheral lower contact hole 182d, the third peripheral lower contact hole 182e and the fourth peripheral lower contact hole 182f, an alignment key may be formed in a scribe lane area simultaneously.

Figure 13A:
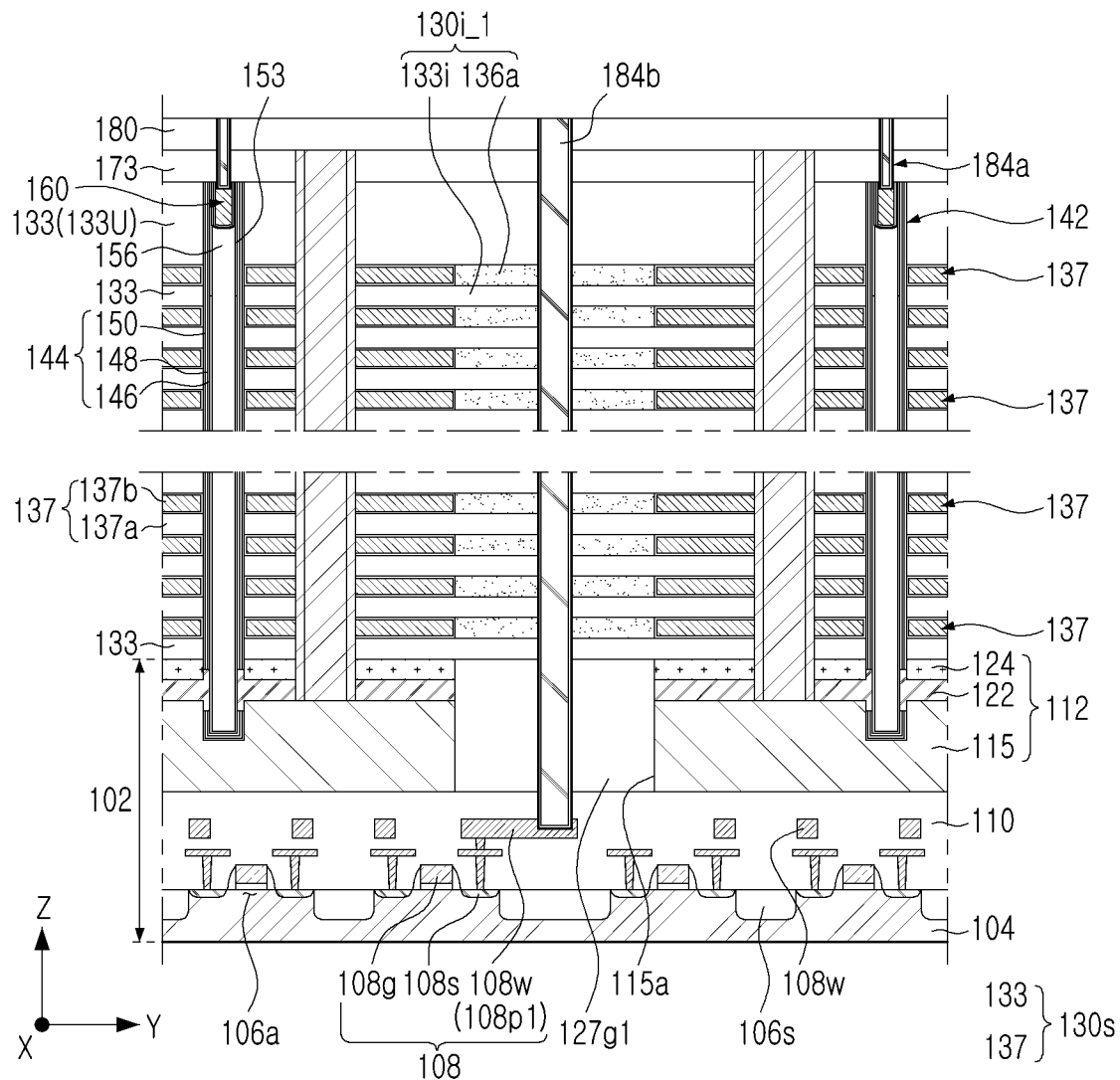
Figure 13B:
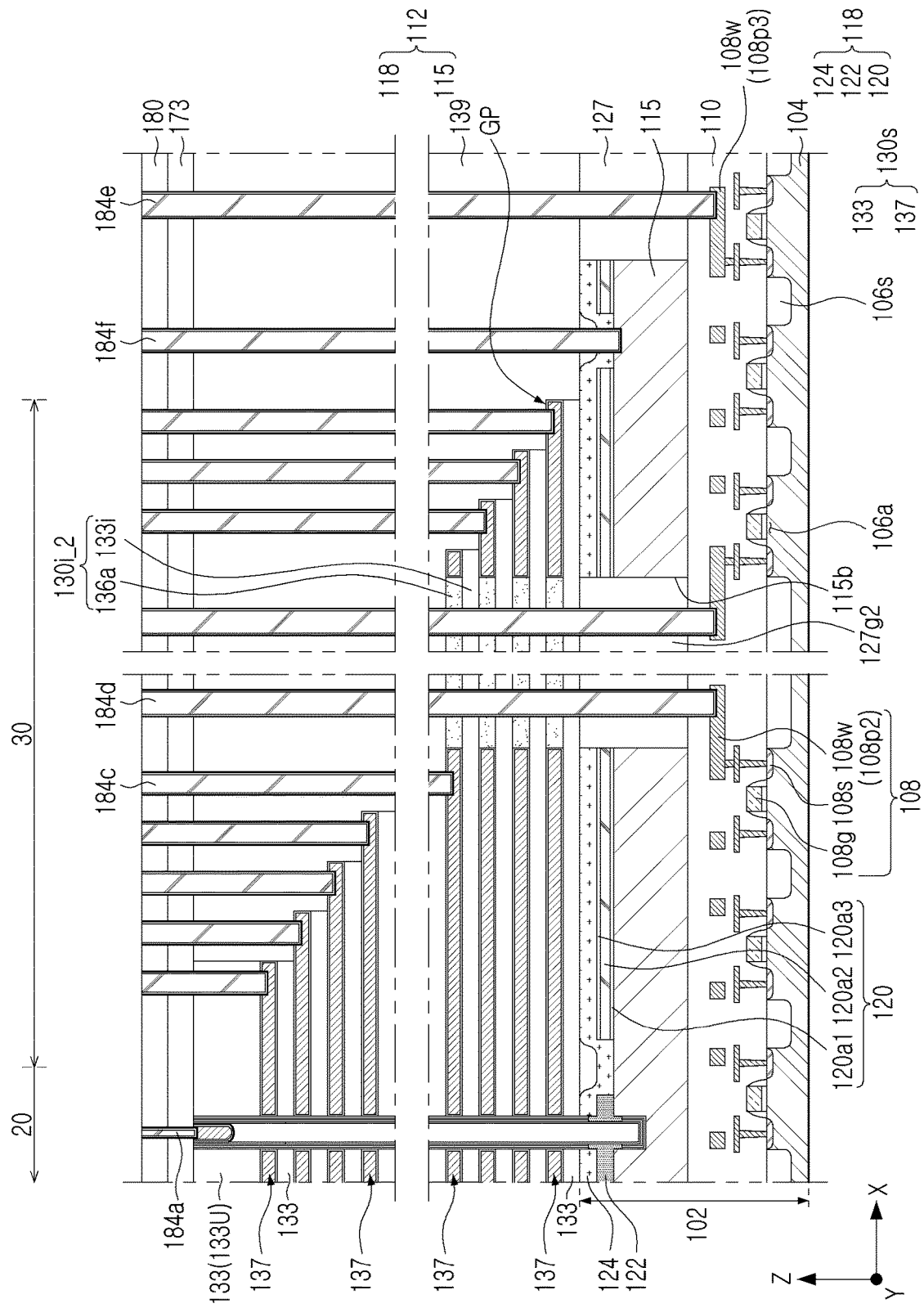

Referring to FIGS. 13A and 13B, a process of simultaneously filling the lower bit line contact hole 182a, the first peripheral lower contact hole 182b, the lower gate contact hole 182c, the second peripheral lower contact hole 182d, the third peripheral lower contact hole 182e and the fourth peripheral lower contact hole 182f, with a conductive material, may be performed. Accordingly, the lower bit line contact plugs 184a, the first peripheral lower contact plug 184b, the lower gate contact plugs 184c, the second peripheral lower contact plug 184d, the third peripheral lower contact plug 184e, and the fourth peripheral lower contact plug 184f may be formed to fill the lower bit line contact hole 182a, the first peripheral lower contact hole 182b, the lower gate contact hole 182c, the second peripheral lower contact hole 182d, and the third peripheral lower contact hole 182e and the fourth peripheral lower contact hole 182f, respectively. Accordingly, the lower bit line contact plugs 184a, the first peripheral lower contact plug 184b, the lower gate contact plugs 184c, the second peripheral lower contact plug 184d, and the third peripheral lower contact plug 184e and the fourth peripheral lower contact plug 184f may be simultaneously formed, thereby improving productivity.

Subsequently, referring to FIGS. 2A and 2B, a third upper insulating layer 183 may be formed on the second upper insulating layer 180. The upper bit line contact plug 188a, the first peripheral upper contact plug 188b, the upper gate contact plug 188c, the second peripheral upper contact plug 188d, the third peripheral upper contact plug 188e, and the fourth peripheral upper contact plug 188f may be simultaneously formed to penetrate through the third upper insulating layer 183. Subsequently, a fourth upper insulating layer 194 may be formed on the third upper insulating layer 183. The bit line 196a, the gate connection wiring 196b, the peripheral connection wiring 196c, and the source connection wiring 196d may be simultaneously formed to penetrate through the fourth upper insulating layer 194.

Next, a modified example of a method of forming a memory device according to an example embodiment will be described with reference to FIGS. 14A to 15B. In FIGS. 14A to 15B, FIGS. 14A and 15A are cross-sectional views illustrating a method of forming the cross-sectional structure of FIG. 2A, and FIGS. 14B and 15B are cross-sectional views illustrating a method of forming the cross-sectional structure of FIG. 2B.

Figure 14A:
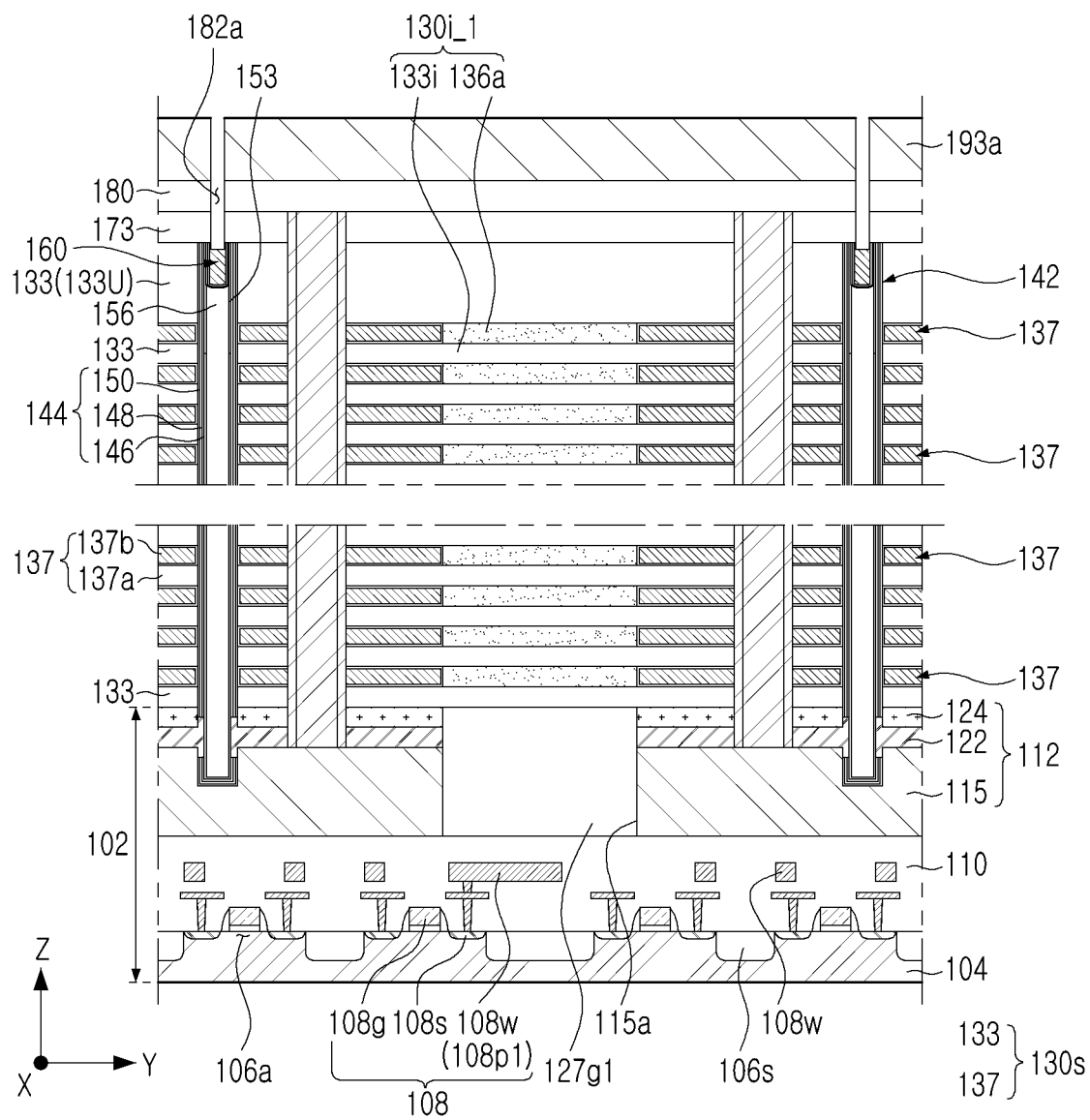
FIGS. 14A to 15B are cross-sectional views illustrating another example of a method of forming a memory device according to an example embodiment.
Figure 14B:
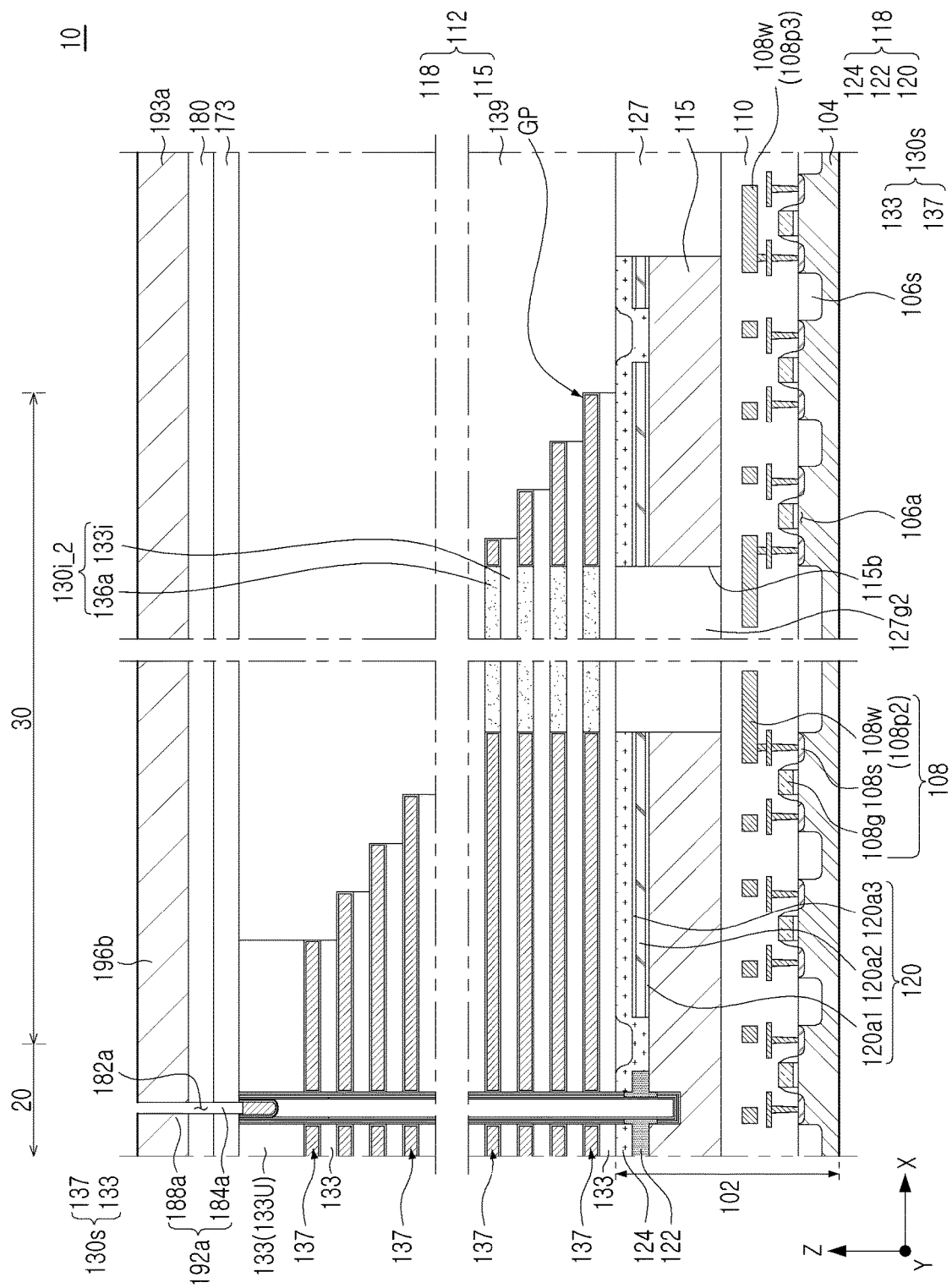

Referring to FIGS. 14A and 14B, a second upper insulating layer 180 may be formed on the result described with reference to FIGS. 11A and 11B. A first mask pattern 193a may be formed on the second upper insulating layer 180. An etching process in which the first mask pattern 193a is used as an etching mask may be performed to form a lower bit line contact hole 182a. The lower bit line contact hole 182a may penetrate through the first and second upper insulating layers 173 and 180 and expose the pad pattern 160 of the vertical structure 142.

In an example, while forming the lower bit line contact hole 182a, an alignment key may be simultaneously formed in the scribe lane area.

Figure 15A:
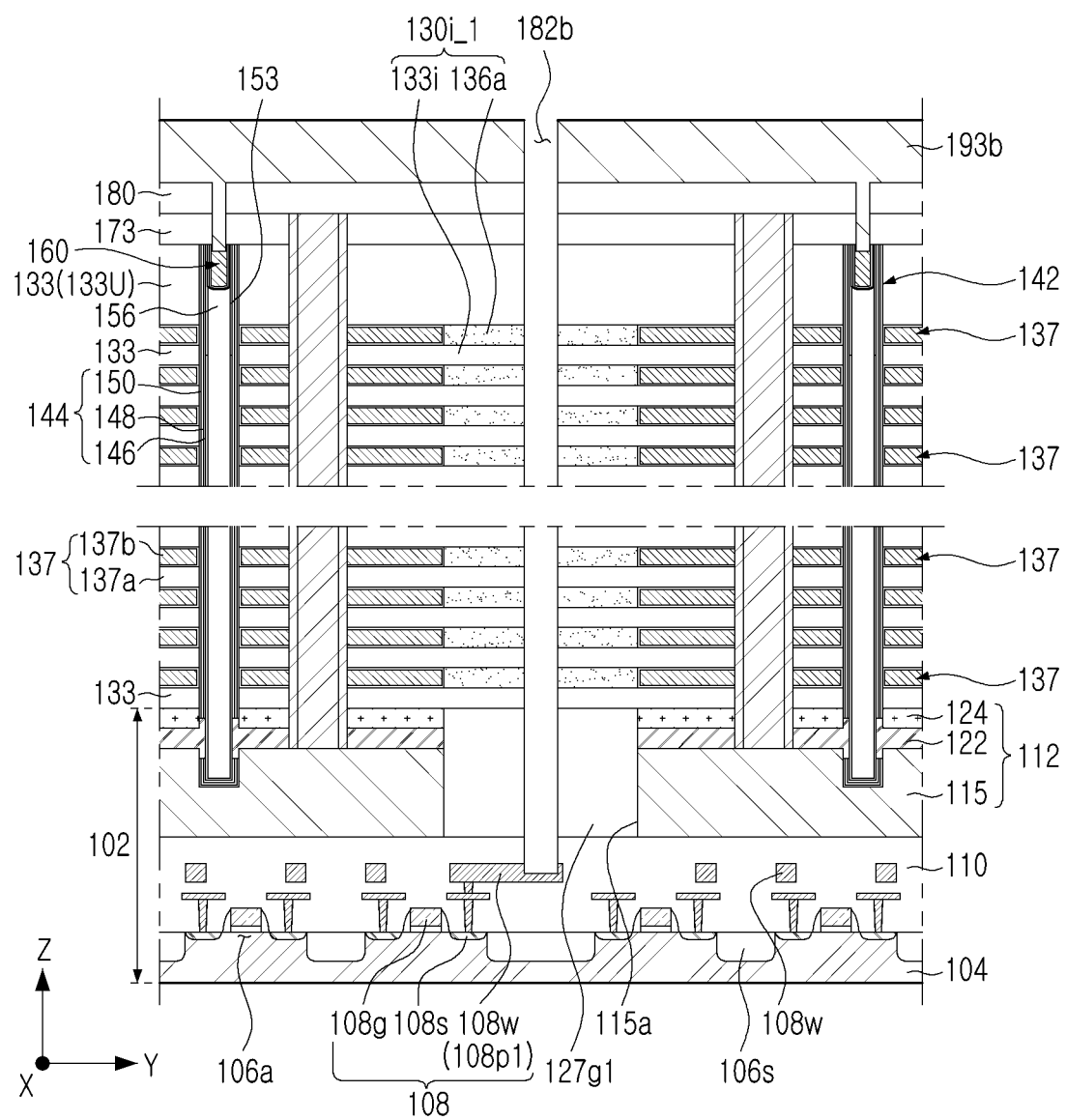
Figure 15B:
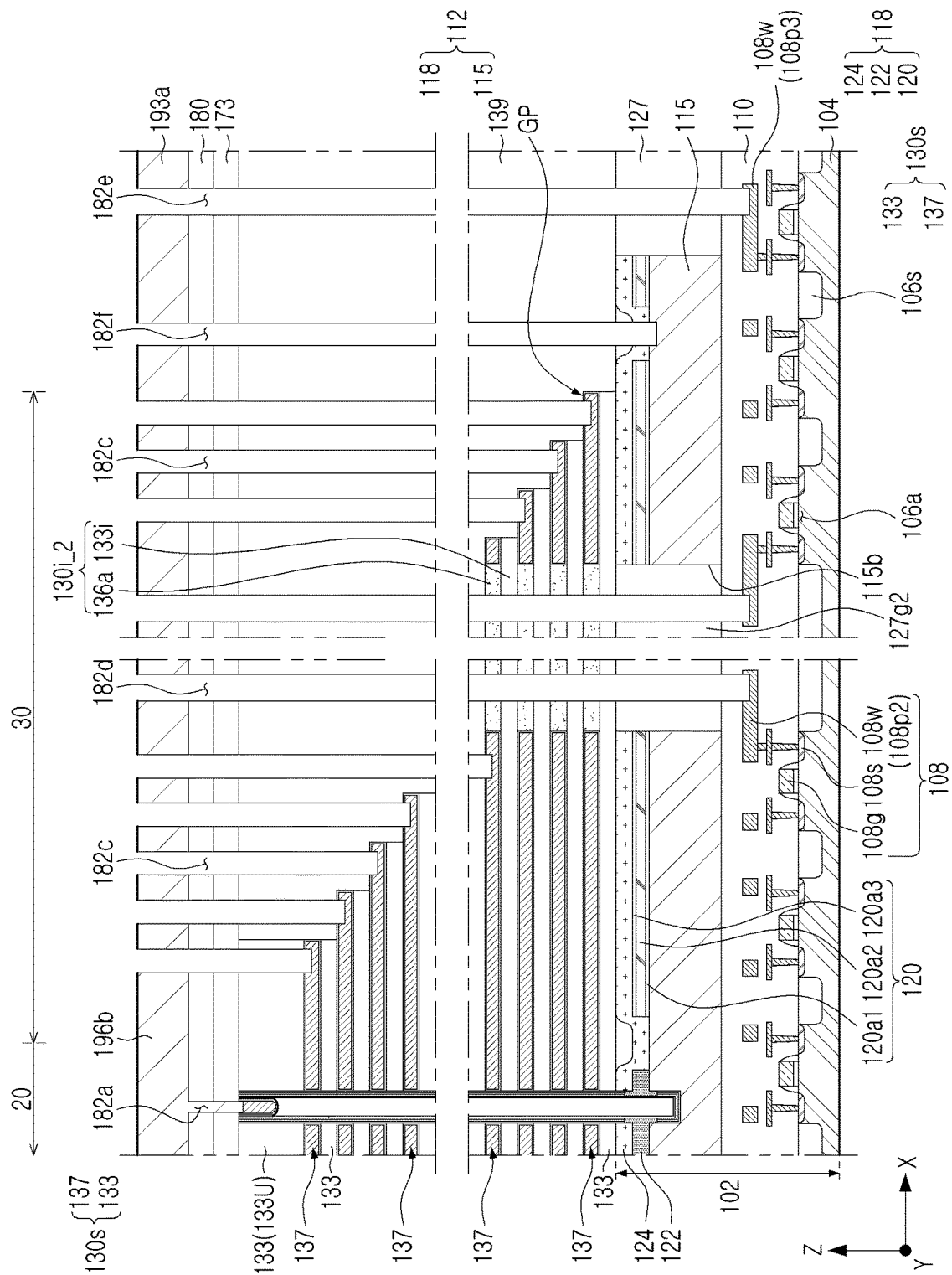

Referring to FIGS. 15A and 15B, after removing the first mask pattern 193a, a second mask pattern 193b may be formed. By performing an etching process using the second mask pattern 193b as an etching mask, the first peripheral lower contact hole 182b, the lower gate contact hole 182c, the second peripheral lower contact hole 182d, the third peripheral lower contact hole 182e, and the fourth peripheral lower contact hole 182f, as described with reference to FIGS. 12A and 12B, may be simultaneously formed. Subsequently, the second mask pattern 193b may be removed. Thus, the same result as in FIGS. 12A and 12B may be formed. Subsequently, as described with reference to FIGS. 13 and 13B, the lower bit line contact plugs 184a, the first peripheral lower contact plug 184b, the lower gate contact plugs 184c, the second peripheral lower contact plug 184d, the third peripheral lower contact plug 184e, and the fourth peripheral lower contact plug 184f may be simultaneously formed.

According to example embodiments, by providing a method of simultaneously forming the lower bit line contact plugs 184a, the first peripheral lower contact plug 184b, the lower gate contact plugs 184c, the second peripheral lower contact plug 184d, the third peripheral lower contact plug 184e and the fourth peripheral lower contact plug 184f, productivity may be improved.

According to example embodiments, the lower bit line contact plugs 184a, the first peripheral lower contact plug 184b, the lower gate contact plugs 184c, the second peripheral lower contact plug 184d, the third peripheral lower contact plug 184e and the fourth peripheral lower contact plug 184f are simultaneously formed, and a pad pattern 160 including the pad metal pattern 170 formed of a metal material may also be provided to prevent etching damage to the channel layer 153 and the dielectric structure 144. Therefore, the productivity and reliability of the memory device 10 may be improved. By forming the pad metal pattern 170 of a metal material, electrical characteristics of the memory device 10 may be improved.

By way of summation and review, example embodiments provide a memory device in which the integration thereof may be improved. Example embodiments provide a memory device in which productivity and reliability may be improved.

That is, as set forth above, according to example embodiments, by providing a method of simultaneously forming lower bit line contact plugs, peripheral lower contact plugs, and lower gate contact plugs, productivity may be improved. To simultaneously form lower bit line contact plugs, lower peripheral contact plugs, and lower gate contact plugs, and to prevent etching damage to a dielectric structure and a channel layer of a vertical structure, a pad pattern including a pad metal pattern formed of a metal material may be provided. Accordingly, the productivity and reliability of a memory device may be improved. As the pad metal pattern is formed of a metal material, electrical characteristics of the memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a lower structure;
   a stacked structure on the lower structure, the stacked structure including horizontal layers and interlayer insulating layers alternately stacked in a vertical direction, and each of the horizontal layers including a gate electrode;
   a vertical structure penetrating through the stacked structure in the vertical direction, the vertical structure including:
      a core region,
      a pad pattern including a pad metal pattern on the core region,
      a dielectric structure including a first portion facing a side surface of the core region, a second portion facing at least a portion of a side surface of the pad metal pattern, and a data storage layer, and
      a channel layer between the dielectric structure and the core region, uppermost surfaces of the channel layer and the pad metal pattern being coplanar;
   a contact structure on and directly in contact with the vertical structure; and
   a conductive line on and directly in contact with an upper surface of the contact structure,
   wherein the contact structure includes:
      a lower contact plug on and directly in contact with the pad metal pattern; and
      an upper contact plug on and directly in contact with the lower contact plug,
   wherein a width of an upper surface of the vertical structure is greater than a width of a lower region of the lower contact plug, and
   wherein an upper end of the vertical structure is at a higher level than a lower end of the lower contact plug.

2. The memory device as claimed in claim 1, wherein the channel layer extends between the second portion of the dielectric structure and the side surface of the pad metal pattern, and between the first portion of the dielectric structure and the core region.

3. The memory device as claimed in claim 1, wherein the pad pattern further includes:
   a pad barrier layer in contact with the side surface of the pad metal pattern and a bottom surface of the pad metal pattern, uppermost surfaces of the pad metal pattern and the pad barrier layer being coplanar; and
   a pad metal-semiconductor compound layer between and in contact with the pad barrier layer and the channel layer,
   wherein the pad metal-semiconductor compound layer and at least a portion of the pad barrier layer are between the channel layer and the side surface of the pad metal pattern.

4. The memory device as claimed in claim 3, wherein the pad pattern further includes a first pad metal layer between the pad barrier layer and the core region, the pad metal-semiconductor compound layer being between the channel layer and the pad barrier layer.

5. The memory device as claimed in claim 1, wherein the pad pattern further includes a pad semiconductor layer between the pad metal pattern and the core region and extending onto the side surface of the pad metal pattern.

6. The memory device as claimed in claim 5, wherein the pad pattern further includes:
   a pad barrier layer covering the side surface of the pad metal pattern and a bottom surface of the pad metal pattern; and
   a pad metal-semiconductor compound layer between the pad barrier layer and the pad semiconductor layer.

7. The memory device as claimed in claim 1,
   wherein the lower contact plug includes:
      a lower plug pattern, and
      a lower barrier layer covering a side surface and a bottom surface of the lower plug pattern, and
   wherein the upper contact plug includes:
      an upper plug pattern, and
      an upper barrier layer covering a side surface and a bottom surface of the upper plug pattern.

8. The memory device as claimed in claim 7, wherein the lower contact plug further includes a lower metal layer covering a bottom surface and an outer side surface of the lower barrier layer.

9. The memory device as claimed in claim 1, further comprising:
   a peripheral contact structure spaced apart from the horizontal layers, the peripheral contact structure including a peripheral lower contact plug and a peripheral upper contact plug on the peripheral lower contact plug,
   wherein the peripheral lower contact plug and the lower contact plug of the contact structure have upper surfaces on a same level as each other.

10. The memory device as claimed in claim 1,
   wherein the conductive line has a line shape extending in a first direction,
   wherein the upper contact plug has a bar shape extending in the first direction,
   wherein a maximum width of the lower contact plug in a second direction is greater than a maximum width of the upper contact plug in the second direction,
   wherein the vertical direction is perpendicular to the first direction and the second direction, and
   wherein the second direction is perpendicular to the first direction.

11. The memory device as claimed in claim 10, wherein a maximum width of the lower contact plug in the first direction is greater than a maximum width of the upper contact plug in the first direction.

12. A memory device, comprising:
   a lower structure;
   a stacked structure on the lower structure, the stacked structure including gate layers and interlayer insulating layers alternately stacked in a vertical direction, and gate pads extending from the gate layers and arranged in a stepped shape;
   a first vertical structure penetrating through the stacked structure in the vertical direction, the first vertical structure including:
      a core region,
      a dielectric structure on a side surface of the core region, the dielectric structure including a data storage layer,
      a pad metal pattern on the core region, and
      a semiconductor layer facing at least a portion of a side surface of the pad metal pattern;
   a first contact structure on the first vertical structure, the first contact structure including:
      a first lower contact plug contacting the first vertical structure, and
      a first upper contact plug on the first lower contact plug and contacting the first lower contact plug;
   gate contact structures on the gate pads, each of the gate contact structures including a lower gate contact plug and an upper gate contact plug on the lower gate contact plug;
   a peripheral contact structure spaced apart from the gate layers, the peripheral contact structure including a peripheral lower contact plug and a peripheral upper contact plug on the peripheral lower contact plug, the peripheral lower contact plug, the lower gate contact plug, and the first lower contact plug having upper surfaces on a same level as each other;
   a conductive line on the first contact structure; and
   gate connection wirings on the gate contact structures.

13. The memory device as claimed in claim 12, wherein the semiconductor layer includes:
   a channel layer between the dielectric structure and the core region, the channel layer including an undoped region and a doped region; and
   a pad semiconductor layer in contact with the channel layer, the pad semiconductor layer having a same conductivity type as the doped region and contacts the doped region.

14. The memory device as claimed in claim 12, wherein the first vertical structure further includes a pad barrier layer covering the side surface of the pad metal pattern and a bottom surface of the pad metal pattern, and a metal-semiconductor compound layer between the pad barrier layer and the semiconductor layer.

15. The memory device as claimed in claim 12, wherein the lower structure includes:
   a substrate;
   a peripheral circuit on the substrate;
   a lower insulating layer covering the peripheral circuit; and
   a pattern structure with an opening on the lower insulating layer,
   wherein the conductive line and the gate connection wirings are on a same level as each other, and
   wherein a lower surface of the peripheral lower contact plug is in contact with a peripheral pad of the peripheral circuit.

16. The memory device as claimed in claim 15, further comprising:
   a second vertical structure penetrating through the stacked structure in the vertical direction, the second vertical structure having a same material and substantially a same cross-sectional structure as the first vertical structure; and
   a second contact structure on the second vertical structure and contacting the second vertical structure, the conductive line being in contact with the first contact structure and the second contact structure.

17. A system, comprising:
a memory device; and
a controller device electrically connected to the memory device, the memory device including:
  a lower structure,
  a stacked structure on the lower structure, the stacked structure including gate layers and interlayer insulating layers alternately stacked in a vertical direction, perpendicular to an upper surface of the lower structure, and gate pads extending from the gate layers and arranged in a stepped shape,
  a vertical structure penetrating through the stacked structure in the vertical direction, the vertical structure including:
    a core region,
    a dielectric structure including a data storage layer, on a side surface of the core region,
    a pad metal pattern on the core region, and
    a semiconductor layer facing at least a portion of a side surface of the pad metal pattern,
  a first contact structure on the vertical structure, the first contact structure including a first lower contact plug contacting the vertical structure, and a first upper contact plug on the first lower contact plug and contacting the first lower contact plug,
  gate contact structures on the gate pads, each of the gate contact structures including a lower gate contact plug and an upper gate contact plug on the lower gate contact plug,
  a second contact structure spaced apart from the gate layers and the vertical structure, the second contact structure including a second lower contact plug and a second upper contact plug on the second lower contact plug, the first lower contact plug, the lower gate contact plug, and the second lower contact plug having upper surfaces on a same level as each other,
  a conductive line on the first contact structure,
  gate connection wirings on the gate contact structures, and
  a peripheral connection wiring on the second contact structure.

18. The system as claimed in claim 17, wherein the vertical structure further includes a pad barrier layer covering a side surface of the pad metal pattern and a bottom surface of the pad metal pattern, and a metal-semiconductor compound layer between the pad barrier layer and the semiconductor layer.

19. The system as claimed in claim 17, wherein the lower structure includes:
  a substrate;
  a peripheral circuit on the substrate;
  a lower insulating layer covering the peripheral circuit; and
  a pattern structure having an opening, on the lower insulating layer,
  wherein the conductive line and the gate connection wirings are on a same level,
  wherein a lower surface of the second lower contact plug is in contact with a peripheral pad of the peripheral circuit, and
  wherein the first lower contact plug, the lower gate contact plug, and the second lower contact plug include lower plug patterns of a same material and lower barrier layers of a same material, the lower barrier layers covering at least a side surface of the lower plug pattern.

20. The system as claimed in claim 19, further comprising a connection structure electrically connecting the controller device and the memory device, the connection structure including a printed circuit board or a board, and the memory device being electrically connected to the connection structure through the second contact structure and the peripheral connection wiring.

\* \* \* \* \*